(12) United States Patent
Kim et al.

(10) Patent No.: US 12,284,874 B2
(45) Date of Patent: Apr. 22, 2025

(54) DISPLAY PANEL AND DISPLAY DEVICE

(71) Applicant: SAMSUNG DISPLAY CO., LTD., Yongin-si (KR)

(72) Inventors: Jisun Kim, Yongin-si (KR); Kyunghoe Lee, Yongin-si (KR); Youngwan Seo, Yongin-si (KR); Keunhee Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 622 days.

(21) Appl. No.: 17/694,966

(22) Filed: Mar. 15, 2022

(65) Prior Publication Data

US 2022/0328590 A1    Oct. 13, 2022

(30) Foreign Application Priority Data

Apr. 9, 2021 (KR) .......................... 10-2021-0046676

(51) Int. Cl.
  *H10K 59/121*    (2023.01)
  *H01L 27/12*    (2006.01)
  *H10K 59/38*    (2023.01)

(52) U.S. Cl.
  CPC ........ H10K 59/1213 (2023.02); *H01L 27/124* (2013.01); *H10K 59/38* (2023.02)

(58) Field of Classification Search
  CPC .. H10K 53/353; H10K 59/1213; H10K 59/38; H10K 59/122; H10K 59/131; H10K 59/88; H01L 27/124; G09G 3/3233; G09G 2300/0413; G09G 2320/045; G09G 2310/0251; G09G 2320/064; G09G 2320/0247; G09G 2300/0408
  See application file for complete search history.

(56) References Cited

U.S. PATENT DOCUMENTS

| | | | |
|---|---|---|---|
| 10,062,316 B2 | 8/2018 | Kim et al. | |
| 2018/0107084 A1* | 4/2018 | Hirata | ............... G02F 1/1345 |
| 2020/0160761 A1* | 5/2020 | Ahn | ............... H10K 50/86 |
| 2020/0219944 A1* | 7/2020 | Yi | ............... H10K 59/88 |

(Continued)

FOREIGN PATENT DOCUMENTS

| | | |
|---|---|---|
| CN | 108321183 A | 7/2018 |
| KR | 1020160083793 A | 7/2016 |

(Continued)

*Primary Examiner* — Shaheda A Abdin
(74) *Attorney, Agent, or Firm* — CANTOR COLBURN LLP

(57) ABSTRACT

A display panel includes a substrate including a main display area, a round display area disposed at a corner portion of the main display area, and a middle display area between the main display area and the round display area, a round display element area arranged in the round display area and including round display elements, and a round pixel circuit area arranged in the middle display area and including round pixel circuits connected to the round display elements and emitting light of a same color. Round display element areas are arranged in different rows and round pixel circuit areas are arranged in different rows. One edge of the round pixel circuit area arranged in a first row from arranged in a same direction is spaced apart from one edge of the round pixel circuit area arranged in a second row by a first distance.

20 Claims, 27 Drawing Sheets

(56) References Cited

U.S. PATENT DOCUMENTS

| | | | |
|---|---|---|---|
| 2021/0384269 A1* | 12/2021 | Zhou | H10K 59/352 |
| 2022/0013611 A1 | 1/2022 | Park et al. | |
| 2022/0069037 A1 | 3/2022 | Kim et al. | |
| 2022/0328590 A1* | 10/2022 | Kim | H10K 59/353 |

FOREIGN PATENT DOCUMENTS

| KR | 1020170132399 A | 12/2017 |
|---|---|---|
| KR | 1020220006682 A | 1/2022 |
| KR | 1020220027351 A | 3/2022 |

\* cited by examiner

DISPLAY PANEL AND DISPLAY DEVICE

This application claims priority to Korean Patent Application No. 10-2021-0046676, filed on Apr. 9, 2021, and all the benefits accruing therefrom under 35 U.S.C. § 119, the content of which in its entirety is herein incorporated by reference.

BACKGROUND

1. Field

Embodiments relate to devices, and more particularly, to a display panel and a display device.

2. Description of the Related Art

Electronic devices based on mobility are coming into widespread use. Recently, tablet personal computers ("PCs"), in addition to small-sized electronic devices such as mobile phones, are being widely used as mobile electronic devices.

In order to support various functions, the mobile electronic devices include a display device for providing a user with visual information such as images or videos. Recently, as components for driving such display devices are being miniaturized, occupancy of the display devices in electronic devices is gradually increasing. Moreover, a structure that may be curved to define a predetermined angle with respect to a flat state is being developed.

SUMMARY

In general, display panels include a round display area in a rim thereof. In this case, the roughness of this round portion is increased according to a manner in which pixels are arranged in the rounded portion, and thus is visually recognized, so that an image is not accurately viewed on the rounded portion of the display area, or a user see the roughness of the rounded portion and thus may mistake the roughness as a product defect. Embodiments include a display panel and display device capable of smoothly visually recognizing a round portion of a display area when a pixel emits light at the round portion of the display area.

Additional features will be set forth in part in the description which follows and, in part, will be apparent from the description, or may be learned by practice of the presented embodiments of the invention In an embodiment of the invention, a display panel includes a substrate including a main display area, a round display area disposed at a corner portion of the main display area and at least partially curved, a middle display area arranged between the main display area and the round display area, a plurality of round display element areas arranged in the round display area and each including a plurality of round display elements each including a pixel electrode, and a plurality of round pixel circuit areas arranged in the middle display area and each including a plurality of round pixel circuits connected to the plurality of round display elements which are arranged in the round display area and emit light of the same color. The plurality of round pixel circuits simultaneously drives the plurality of round display elements. The plurality of round display element areas is arranged in different rows and the plurality of round pixel circuit areas is arranged in different rows, and one edge of a round pixel circuit area arranged in a first row from among the plurality of round pixel circuit areas arranged in a same direction is spaced apart from one edge of a round pixel circuit area arranged in a second row from among the plurality of round pixel circuit areas by a first distance.

In an embodiment, the first distance may be a width of one edge of a main unit area arranged in the main display area, wherein a plurality of main display elements each including a pixel electrode is arranged in the main display area.

In an embodiment, the first distance may be twice the width of one edge of the main unit area arranged in the main display area, wherein a plurality of main display elements each including a pixel electrode is arranged in the main display area.

In an embodiment, the first distance may be half of the width of one edge of the main unit area arranged in the main display area, wherein a plurality of main display elements each including a pixel electrode is arranged in the main display area.

In an embodiment, a width of one edge of one of the plurality of round display element areas may be four times a width of one edge of a main unit area arranged in the main display area, wherein a plurality of main display elements each including a pixel electrode is arranged in the main unit area.

In an embodiment, the width of one edge of one of the plurality of round display element areas may be twice the width of one edge of the main unit area arranged in the main display area, wherein a plurality of main display elements each including a pixel electrode is arranged in the main unit area.

In an embodiment, a planar area of one of the plurality of round display element areas may be twice a planar area of one of the plurality of round pixel circuit areas.

In an embodiment, a planar area of one of the plurality of round display element areas may be equal to the planar area of one of the plurality of round pixel circuit areas.

In an embodiment, the plurality of round display elements may include a plurality of first round display elements which emit light of a first color, a plurality of second round display elements which emit light of a second color, and a plurality of third round display elements which emit light of a third color.

In an embodiment, the plurality of round pixel circuits may include a first pixel circuit connected to the plurality of first round display elements, a second pixel circuit connected to the plurality of second round display elements, and a third pixel circuit connected to the plurality of third round display elements.

In an embodiment, at least one of the plurality of round display elements may be included in the plurality of round pixel circuit areas.

In an embodiment, some of the plurality of middle display elements may be connected to one another and emit light of a same color.

In an embodiment, a rim of at least one of the round display area and the middle display area may be round.

In an embodiment, a plurality of main display elements may be arranged in the main display area.

In an embodiment, the plurality of main display elements may be arranged in the same manner as the plurality of round display elements.

In an embodiment of the invention, a display panel includes a substrate including a main display area, a round display area having a round boundary arranged adjacent to a round portion of the substrate and including a plurality of round display element areas in which a plurality of round display elements which emit light of the same color is arranged, and a middle display area arranged between the round display area and the main display area and including a middle display element area in which a plurality of middle display elements which emit light of a same color is arranged and including a round pixel circuit area in which a round pixel circuit connected to a round display element of plurality of round display elements is arranged and a plurality of middle pixel circuit areas in which a middle pixel circuit connected to the middle display element is arranged. The plurality of round display element areas is arranged in different rows, and the plurality of middle pixel circuit areas is arranged in different rows, and the plurality of middle pixel circuit areas in different rows is arranged in a stepwise manner.

In an embodiment, a main unit area in which a plurality of main display elements are arranged may be arranged in the main display area, and a distance by which respective one edges of the plurality of middle pixel circuit areas arranged in different rows are spaced apart from each other may be equal to a width of the main unit area in one direction or may be twice the width.

In an embodiment, a main unit area in which a plurality of main display elements may be arranged may be arranged in the main display area, and a distance by which respective one edges of the plurality of middle pixel circuit areas arranged in different rows are spaced apart from each other may be half of the width of the main unit area in one direction.

In an embodiment, the plurality of round display element areas arranged in different rows in the round portion of the round display area may be arranged in a stepwise manner.

In an embodiment of the invention, a display device includes a display panel and a window arranged on the display panel. The display panel includes a substrate including a main display area, a round display area disposed at a corner portion of the main display area, and a middle display area arranged between the main display area and the round display area, a plurality of round display element areas arranged in the round display area and including a plurality of round display elements each including a pixel electrode, and a plurality of round pixel circuit areas arranged in the middle display area and each including a plurality of round pixel circuits connected to the plurality of round display elements which are arranged in the round display area and emit light of the same color. The plurality of round pixel circuits simultaneously drives the plurality of round display elements. The plurality of round display element areas is arranged in different rows and the plurality of round pixel circuit areas is arranged in different rows, and one edge of a round pixel circuit area arranged in a first row from among the plurality of round pixel circuit areas arranged in a same direction is spaced apart from one edge of a round pixel circuit area arranged in a second row from among the plurality of round pixel circuit areas by a first distance.

These and/or other features will become apparent and more readily appreciated from the following description of the embodiments, taken in conjunction with the accompanying drawings.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Figure 1:
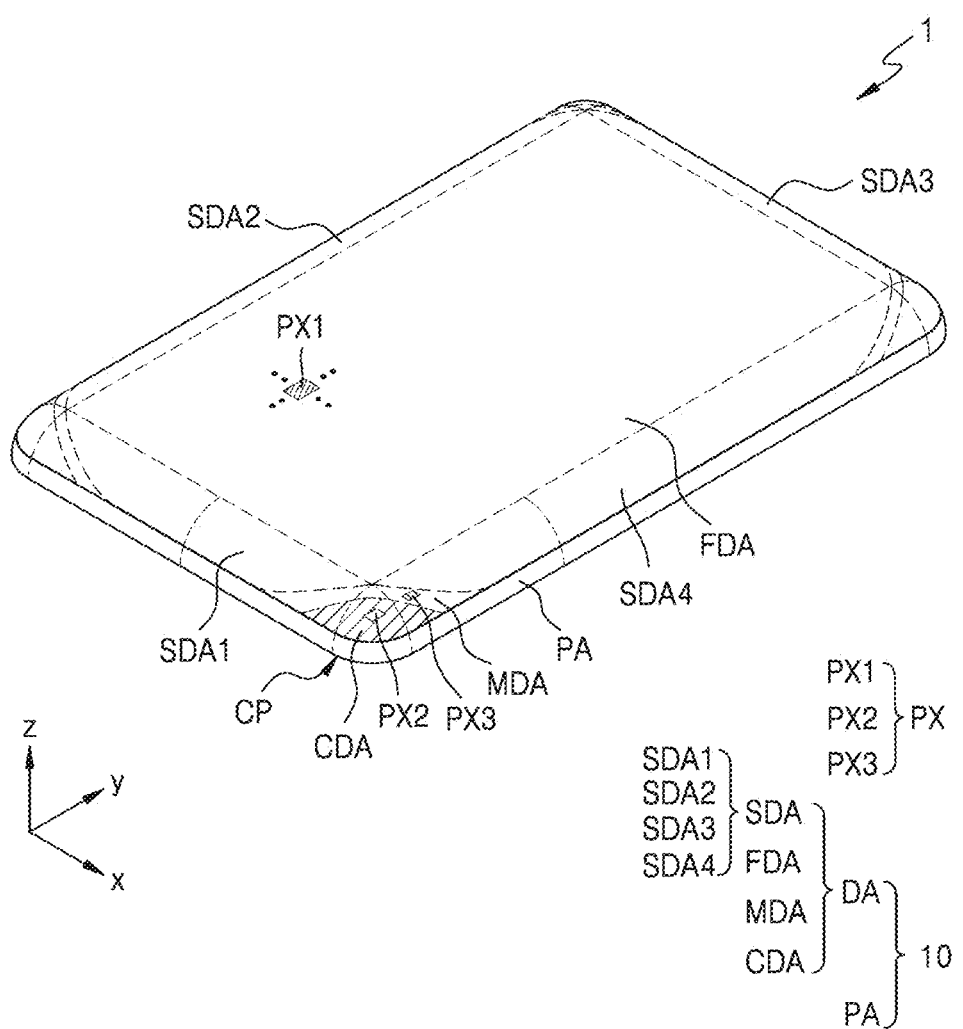
FIG. 1 is a schematic perspective view of an embodiment of a display device according to the invention.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the invention and a method for accomplishing them will be described more fully with reference to the accompanying drawings, in which embodiments of the invention are shown. The invention may, however, be embodied in many different forms and should not be construed as limited to the embodiments set forth herein.

Embodiments of the invention will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. Since sizes and thicknesses of components in the drawings are arbitrarily illustrated for convenience of explanation, the invention is not limited thereto.

In the following examples, the x-axis, the y-axis and the z-axis are not limited to three axes of the rectangular coordinate system, and may be interpreted in a broader sense. The x-axis, the y-axis, and the z-axis may be perpendicular to one another, or may represent different directions that are not perpendicular to one another, for example.

When a certain embodiment may be implemented differently, a specific process order may be performed differently from the described order. Two consecutively described processes may be performed substantially at the same time or performed in an order opposite to the described order, for example.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2A:
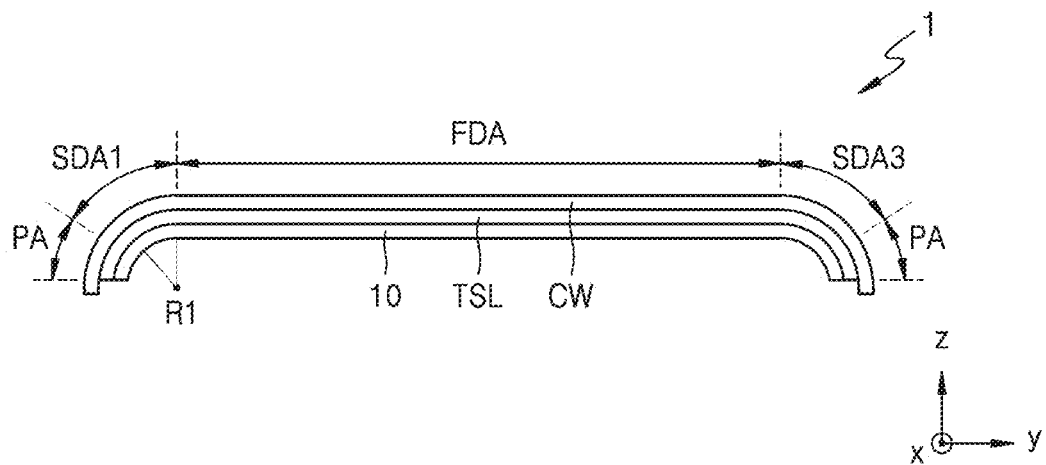
FIGS. 2A, 2B, and 2C are schematic cross-sectional views of an embodiment of the display device according to the invention.
Figure 2B:
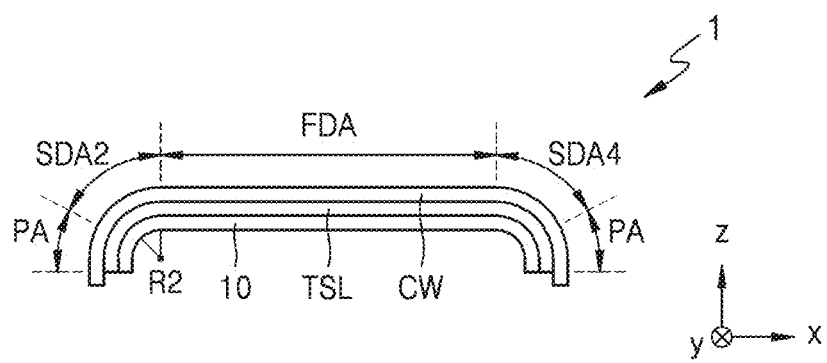
Figure 2C:
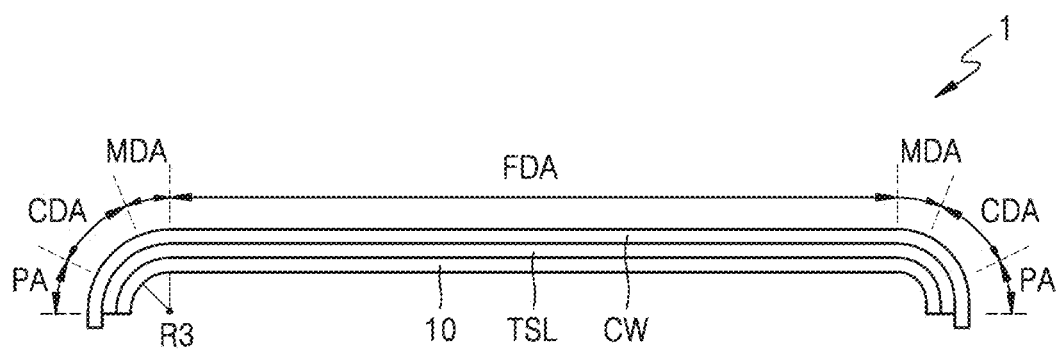

FIG. 1 is a schematic perspective view of an embodiment of a display device 1 according to the invention. FIGS. 2A, 2B, and 2C are schematic cross-sectional views of an embodiment of the display device 1 according to the invention.

Referring to FIGS. 1 through 2C, the display device 1 displays a moving picture or a still image, and thus may be used as the display screens of various products such as not only portable electronic apparatuses, such as mobile phones, smartphones, tablet personal computers ("PCs"), mobile communication terminals, electronic notebooks, electronic books, portable multimedia players ("PMPs"), navigation devices, and ultra-mobile PCs ("UMPCs") but also televisions, notebooks, monitors, advertisement panels, and internet of things ("IoT") devices. The display device 1 may also be used in wearable devices such as smart watches, watch phones, glasses-type displays, and head mounted displays ("HMDs"). The display device 1 may also be used as dashboards of automobiles, center information displays ("CIDs") of the center fasciae or dashboards of automobiles, room mirror displays that replace the side mirrors of automobiles, and displays arranged on the rear sides of front seats to serve as entertainment devices for back seat passengers of automobiles.

In an embodiment, the display device 1 may have longer edges in a first direction and shorter edges in a second direction. The first direction and the second direction may intersect with each other. In an embodiment, the first direction and the second direction may define an acute angle, for example. In another embodiment, the first direction and the second direction may define an obtuse angle or a right angle. A case where the first direction (e.g., a y direction or a −y direction) and the second direction (e.g., an x direction or a −x direction) define a right angle will be described in detail.

In another embodiment, the length of an edge of the display device 1 in the first direction (e.g., the y direction or the −y direction) may be equal to that of an edge of the display device 1 in the second direction (e.g., the x direction or the −x direction). In another embodiment, the display device 1 may have shorter edges in the first direction (e.g., the y direction or the −y direction) and longer edges in the second direction (e.g., the x direction or the −x direction).

Corners between the longer edges in the first direction (e.g., the y direction or the −y direction) and the shorter edges in the second direction (e.g., the x direction or the −x direction) may be rounded to have a predetermined curvature.

The display device 1 may include a display panel 10, a touch screen layer TSL, and a cover window CW. In this case, the cover window CW may protect the display panel 10.

The cover window CW may be a flexible window. The cover window CW may protect the display panel 10 while being easily bent along an external force without generating cracks or the like. The cover window CW may include glass, sapphire or plastic. In an embodiment, the cover window CW may be tempered glass (e.g., ultra-thin glass ("UTG")) or colorless polyimide ("CPI"), for example. In an embodiment, the cover window CW may have a structure in which a flexible polymer layer is arranged on one surface of a glass substrate, or may only include a polymer layer.

The display panel 10 may be disposed below the cover window CW. Although not shown in FIGS. 2A through 2C, the display panel 10 may be attached to the cover window CW by a transparent adhesion member such as an optically clear adhesive ("OCA") film.

The display panel 10 may include a display area DA displaying an image, and a peripheral area PA surrounding the display area DA. The display area DA may include a plurality of pixels PX, and may display an image through the plurality of pixels PX. Each of the plurality of pixels PX may include subpixels. In an embodiment, each of the plurality of pixels PX may include a red subpixel, a green subpixel, and a blue subpixel, for example. In an alternative embodiment, each of the plurality of pixels PX may include red, green, blue, and white subpixels. However, the invention is not limited thereto, and each of the plurality of pixels PX may include various other color subpixels.

The display area DA may include a main display area FDA, a side display area SDA, a round display area CDA, and a middle display area MDA. A plurality of pixels PX arranged in each of the main display area FDA, the side display area SDA, the round display area CDA, and the middle display area MDA may display an image. In an embodiment, the respective pixels PX of the main display area FDA, the side display area SDA, the round display area CDA, and the middle display area MDA may provide independent images. In another embodiment, the respective pixels PX of the main display area FDA, the side display area SDA, the round display area CDA, and the middle display area MDA may provide portions of one image, respectively.

The main display area FDA may be a flat display area, and may include first pixels PX1 each including a main display element. In an embodiment, the main display area FDA may provide a most part of an image.

In an embodiment, the main display element may include a light-emitting diode. The light-emitting diode may include an organic light-emitting diode including an organic material, as an emission layer. In an alternative embodiment, the light-emitting diode may include an inorganic light-emitting diode. In an alternative embodiment, the light-emitting diode may include quantum dots as an emission layer. In an embodiment, the size of the light-emitting diode may be microscale or nanoscale. In an embodiment, the light-emitting diode may be a micro light-emitting diode, for example. In another embodiment, the light-emitting diode may be a nanorod light-emitting diode. The nanorod light-emitting diode may include gallium nitride (GaN). In an embodiment, a color converting layer may be arranged on the nanorod light-emitting diode. The color converting layer may include quantum dots.

For convenience of description, a case where the light-emitting diode includes an organic light-emitting diode will now be described in detail. In an embodiment, the organic light-emitting diode may include a pixel electrode, an emission layer including an organic material, and an opposite electrode.

Pixels PX each including a side display element may be arranged in the side display area SDA. Accordingly, the side display area SDA may display an image. In an embodiment, the side display area SDA may include a first side display area SDA1, a second side display area SDA2, a third side display area SDA3, and a fourth side display area SDA4. According to some embodiments, at least one of the first side display area SDA1, the second side display area SDA2, the third side display area SDA3, and the fourth side display area SDA4 may be omitted.

The first side display area SDA1 and the third side display area SDA3 may be connected to the main display area FDA in the first direction (e.g., the y direction or the -y direction). In an embodiment, the first side display area SDA1 may extend from the main display area FDA in the -y direction, and the third side display area SDA3 may extend from the main display area FDA in the y direction, for example.

The first side display area SDA1 and the third side display area SDA3 may be bent with radii of curvature. In an embodiment, the radii of curvature of the first side display area SDA1 and the third side display area SDA3 may be different from each other. In another embodiment, the radii of curvature of the first side display area SDA1 and the third side display area SDA3 may be the same as each other. A case where each of the first side display area SDA1 and the third side display area SDA3 has the same radius of curvature, namely, a first radius of curvature R1, will now be described in detail. Because the first side display area SDA1 and the third side display area SDA3 are the same as each other or similar to each other, the first side display area SDA1 will now be focused on and described in detail.

The second side display area SDA2 and the fourth side display area SDA4 may be connected to the main display area FDA in the second direction (e.g., the x direction or the -x direction). In an embodiment, the second side display area SDA2 may extend from the main display area FDA in the -x direction, and the fourth side display area SDA4 may extend from the main display area FDA in the x direction, for example.

The second side display area SDA2 and the fourth side display area SDA4 may be bent with radii of curvature. In an embodiment, the radii of curvature of the second side display area SDA2 and the fourth side display area SDA4 may be different from each other. In another embodiment, the radii of curvature of the second side display area SDA2 and the fourth side display area SDA4 may be the same as each other. A case where each of the second side display area SDA2 and the fourth side display area SDA4 has the same radius of curvature, namely, a second radius of curvature R2, will now be described in detail. Because the second side display area SDA2 and the fourth side display area SDA4 are the same as each other or similar to each other, the second side display area SDA2 will now be focused on and described in detail.

In an embodiment, the first radius of curvature R1 of the first side display area SDA1 may be different from the second radius of curvature R2 of the second side display area SDA2. In an embodiment, the first radius of curvature R1 may be less than the second radius of curvature R2, for example. In another embodiment, the first radius of curvature R1 may be greater than the second radius of curvature R2. In another embodiment, the first radius of curvature R1 of the first side display area SDA1 may be equal to the second radius of curvature R2 of the second side display area SDA2. A case where the first radius of curvature R1 is greater than the second radius of curvature R2 will now be focused on and described in detail.

The round display areas CDA may be arranged at each corner of the main display area FDA and may be bent. In other words, the round display areas CDA may be arranged to correspond to corner portions CP. The corner portions CP are the corners of the display area DA, and thus may be portions of the display area DA where the longer edges of the display area DA in the first direction (e.g., the y direction or the -y direction) and the shorter edges thereof in the second direction (e.g., the x direction or the -x direction) meet each other. The round display area CDA may be disposed between adjacent side display areas SDA. In an embodiment, the round display area CDA may be disposed between the first and second side display areas SDA1 and SDA2, for example. In an alternative embodiment, the round display area CDA may be disposed between the second side display area SDA2 and the third side display area SDA3, between the third side display area SDA3 and the fourth side display area SDA4, or between the fourth side display area SDA4 and the first side display area SDA1. Accordingly, the side display area SDA and the round display area CDA may surround the main display area FDA and may be bent.

Second pixels PX2 each including a round display element may be arranged in the round display area CDA. Accordingly, the round display area CDA may display an image.

When the first radius of curvature R1 of the first side display area SDA1 is different from the second radius of curvature R2 of the second side display area SDA2, the radius of curvature of the round display area CDA may be gradually changed. In an embodiment, when the first radius of curvature R1 of the first side display area SDA1 is greater than the second radius of curvature R2 of the second side display area SDA2, the radius of curvature of the round display area CDA may gradually decrease from the first side display area SDA1 to the second side display area SDA2. In an embodiment, the third radius of curvature R3 of the round display area CDA may be less than the first radius of curvature R1 and may be greater than the second radius of curvature R2, for example.

The middle display area MDA may be disposed between the round display area CDA and the main display area FDA. In an embodiment, the middle display area MDA may extend between the side display area SDA and the round display area CDA. In an embodiment, the middle display area MDA may extend between the first side display area SDA1 and the round display area CDA, for example. The middle display area MDA may also extend between the second side display area SDA2 and the round display area CDA.

The middle display area MDA may include third pixels PX3. In an embodiment, a driving circuit for providing an electrical signal or voltage wiring for providing a voltage may be arranged in the middle display area MDA, and the third pixels PX3 may overlap the driving circuit or the power wiring. In this case, the middle display elements of the third pixels PX3 may be disposed over the driving circuit or the power wiring. In another embodiment, a round pixel circuit connected to the round display element of the round display area CDA to apply a signal may be arranged in the middle display area MDA, and the driving circuit may be arranged in the round display area CDA. According to some embodiments, the driving circuit or the power wiring may be arranged in the peripheral area PA, and the third pixels PX3 may not overlap the driving circuit or the power wiring.

In the illustrated embodiment, the display device 1 may display an image not only in the main display area FDA but also in the side display area SDA, the round display area CDA, and the middle display area MDA. Accordingly, occupancy of the display area DA in the display device 1 may increase. Because the display device 1 is bent at its corners and includes the round display areas CDA displaying an image, a sense of beauty may improve.

Figure 3:
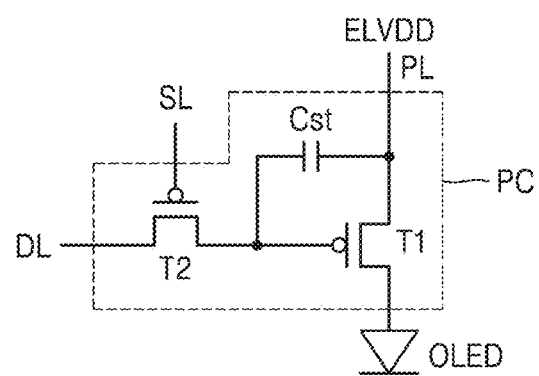
FIG. 3 is a schematic equivalent circuit diagram of a pixel circuit that is applicable to a display panel.

FIG. 3 is a schematic equivalent circuit diagram of a pixel circuit PC that is applicable to a display panel.

Referring to FIG. 3, the pixel circuit PC may include a main pixel circuit arranged in the main display area FDA and a side pixel circuit arranged in the side display area SDA. The pixel circuit PC may also include a middle pixel circuit, which is arranged in the middle display area MDA, and a round pixel circuit. The pixel circuit PC may be connected to a display element, for example, an organic light-emitting diode OLED, arranged in each area.

The pixel circuit PC may include a driving thin-film transistor T1, a switching thin-film transistor T2, and a storage capacitor Cst. The organic light-emitting diode OLED may emit red light, green light, or blue light, or may emit red light, green light, blue light, or white light.

The switching thin-film transistor T2 may be connected to a scan line SL and a data line DL, and may transmit, to the driving thin-film transistor T1, a data signal or data voltage received via the data line DL according to a scan signal or switching voltage received via the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a predetermined brightness by the driving current. An opposite electrode (e.g., a cathode) of the organic light-emitting diode OLED may receive a second power supply voltage ELVSS. In an embodiment, a voltage level of the second power supply voltage ELVSS may be lower than that of the first power supply voltage ELVDD. In an embodiment, the opposite electrode (e.g., a cathode) of the organic light-emitting diode OLED may be connected to the ground and receive a voltage of 0 volt (V).

In FIG. 3, the pixel circuit PC includes two thin-film transistors and one storage capacitor. However, the pixel circuit PC may include three, four, five, or more thin-film transistors.

Figure 4A:
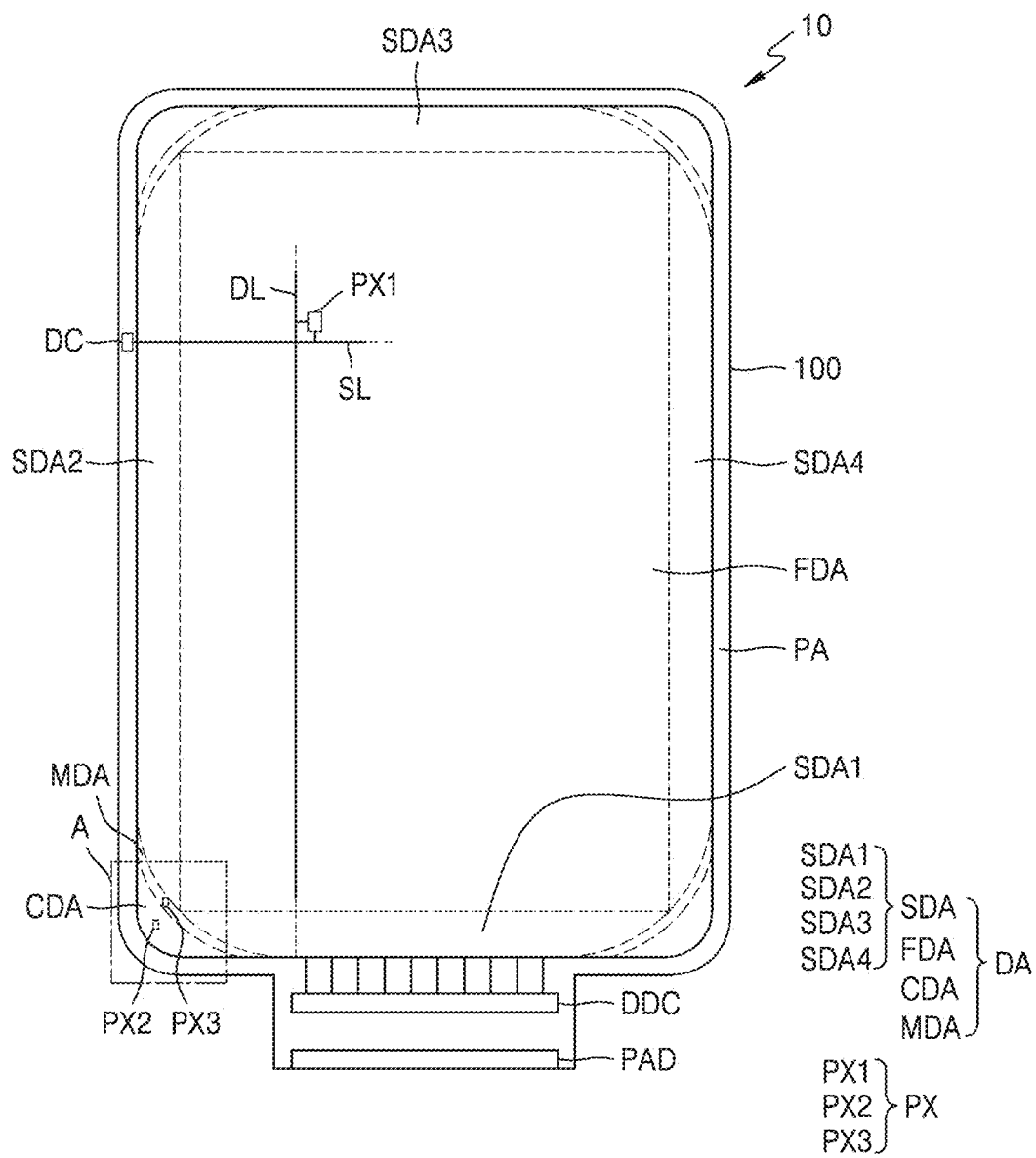
FIG. 4A is a schematic plan view of an embodiment of a display panel according to the invention.

FIG. 4A is a schematic plan view of an embodiment of the display panel 10 according to the invention.

Referring to FIG. 4A, the display panel 10 may include a display element. In an embodiment, the display panel 10 may be an organic light-emitting display panel including an organic light-emitting diode including an organic emission layer as a display element, for example. In an alternative embodiment, the display panel 10 may be a light-emitting diode display panel using a light-emitting diode ("LED"). The size of the light-emitting diode may be microscale or nanoscale. In an alternative embodiment, the display panel 10 may be a quantum dot light-emitting display panel using a quantum dot light-emitting diode. In an alternative embodiment, the display panel 10 may be an inorganic light-emitting display panel using an inorganic light-emitting diode. A case where the display panel 10 is an organic light-emitting display panel using an organic light-emitting diode as a display element will now be focused on and described in detail.

The display panel 10 may include the display area DA and the peripheral area PA. The display area DA displays an image by a plurality of pixels PX, and the peripheral area PA surrounds at least a portion of the display area DA. The display area DA may include a main display area FDA, a side display area SDA, a round display area CDA, and a middle display area MDA.

Each of the pixels PX may include subpixels, and each of the subpixels may emit light of a predetermined color by an organic light-emitting diode as a display element. A subpixel, as used herein, refers to a light-emission area as a minimum unit that realizes an image. When an organic light-emitting diode is used as a display element, the light-emission area may be defined by an opening of a pixel defining layer. This will be described later.

Each organic light-emitting diode may emit, for example, red light, green light, or blue light. Each organic light-emitting diode may be connected to a pixel circuit including a thin-film transistor and a storage capacitor.

The display panel 10 may include a substrate 100, and a multi-layer arranged on the substrate 100. The display area DA and the peripheral area PA may be defined in the substrate 100 and/or the multi-layer. In other words, the substrate 100 and/or the multi-layer may include the main display area FDA, the side display area SDA, the round display area CDA, the middle display area MDA, and the peripheral area PA.

The substrate 100 may include polymer resin such as glass, polyethersulfone, polyacrylate, polyetherimide, polyethylene naphthalate, polyethylene terephthalate ("PET"), polyphenylene sulfide, polyimide, polycarbonate, cellulose triacetate, or cellulose acetate propionate. The substrate 100 including polymer resin may have flexible, rollable, and bendable characteristics. The substrate 100 may have a multi-layered structure including a base layer including the aforementioned polymer resin and a barrier layer (not shown).

The peripheral area PA does not provide an image, and thus may be a non-display area. A driving circuit DC for providing an electrical signal to each pixel PX or power wiring for providing power, for example, may be arranged in the peripheral area PA. The driving circuit DC for providing the electrical signal to each pixel PX through a signal line may be arranged in the peripheral area PA. In an embodiment, the driving circuit DC may be a scan driving circuit that provides a scan signal to each pixel P via a scan line SL, for example. In an alternative embodiment, the driving circuit DC may be a data driving circuit DDC that provides a data signal to each pixel P via a data line DL. In an embodiment, the data driving circuit DDC may be arranged on one lateral side of the display panel 10 to be adjacent thereto. In an embodiment, the data driving circuit DDC in the peripheral region PA may be arranged to correspond to the first side display area SDA1, for example.

The peripheral area PA may include a pad unit (not shown) that is an area where an electronic device, a printed circuit board ("PCB"), or the like may be electrically connected. The pad unit may be exposed without being covered with an insulating layer, and may be electrically connected to a flexible PCB ("FPCB"). The FPCB may electrically connect a controller to the pad unit, and may provide a signal or power received from the controller. In some embodiments, the data driving circuit DDC may be disposed on the FPCB.

First pixels PX1 each including a display element may be arranged in the main display area FDA. The main display area FDA may be a flat portion. In an embodiment, the main display area FDA may provide a most part of an image.

The side display area SDA may include pixels PX each including a display element and may be bent. In other words, the side display area SDA may be bent from the main display area FDA as described above with reference to FIG. 1. In an embodiment, a width of the side display area SDA may gradually decrease in a direction away from the main display area FDA. In an embodiment, the side display area SDA may include a first side display area SDA1, a second side display area SDA2, a third side display area SDA3, and a fourth side display area SDA4.

The first side display area SDA1 and the third side display area SDA3 may be connected to the main display area FDA in the first direction (e.g., the y direction or the −y direction). The first side display area SDA1 and the third side display area SDA3 may extend from the main display area FDA in the first direction (e.g., the y direction or the −y direction). The second side display area SDA2 and the fourth side display area SDA4 may be connected to the main display area FDA in the second direction (e.g., the x direction or the −x direction). The second side display area SDA2 and the fourth side display area SDA4 may extend from the main display area FDA in the second direction (e.g., the x direction or the −x direction).

The round display area CDA may be disposed between adjacent side display areas SDA. In an embodiment, the round display area CDA may be disposed between the first and second side display areas SDA1 and SDA2, for example. In an alternative embodiment, the round display area CDA may be disposed between the second side display area SDA2 and the third side display area SDA3, between the third side display area SDA3 and the fourth side display area SDA4, or between the fourth side display area SDA4 and the first side display area SDA1. The round display area CDA arranged between the first side display area SDA1 and the second side display area SDA2 will now be focused on and described in detail.

The round display area CDA may be arranged to correspond to each corner portion CP of the display area DA. The corner portions CP are the corners of the display area DA, and thus may be portions of the display area DA where the longer edges of the display area DA in the first direction (e.g., the y direction or the −y direction) and the shorter edges thereof in the second direction (e.g., the x direction or the −x direction) meet each other.

The round display area CDA may surround at least a portion of the main display area CDA. In an embodiment, the round display area CDA may be disposed between the first side display area SDA1 and the second side display area SDA2 and may surround at least a portion of the main display area FDA, for example.

The round display area CDA may include second pixels PX2 each including a display element and may be bent. In other words, the round display area CDA may be arranged in correspondence with the corner portion CP and may be bent from the main display area FDA, as described above with reference to FIG. 1.

The middle display area MDA may be disposed between the main display area FDA and the round display area CDA. In an embodiment, the middle display area MDA may extend between the side display area SDA and the round display area CDA. In an embodiment, the middle display area MDA may extend between the first side display area SDA1 and the round display area CDA and/or between the second side display area SDA2 and the round display area CDA, for example. In an embodiment, the middle display area MDA may be bent.

Third pixels PX3 each including a middle display element may be arranged in the middle display area MDA. A plurality of middle display elements may be included. In this case, some of the plurality of middle display elements that emit light of the same color may be connected to each other and may simultaneously emit light beams. In an embodiment, the plurality of middle display elements may include a first middle display element that emits light of a first color, a second middle display element that emits light of a second color, and a third middle display element that emits light of a third color, for example. In this case, a plurality of first middle display elements, a plurality of second middle display elements, and a plurality of third middle display elements may be included. In this case, some of the plurality of first middle display elements may be connected to each other and may simultaneously emit light beams, some of the plurality of second middle display elements may be connected to each other and may simultaneously emit light beams, and some of the plurality of third middle display elements may be connected to each other and may simultaneously emit light beams. The number of first middle display elements connected to each other, the number of second middle display elements connected to each other, and the number of third middle display elements connected to each other may be the same as each other or different from each other. In detail, two first middle display elements may be connected to each other, two second middle display elements may be connected to each other, and two third middle display elements may be connected to each other. In another embodiment, one of the number of first middle display elements connected to each other, the number of second middle display elements connected to each other, and the number of third middle display elements connected to each other may be eight, and the other numbers may be each four.

In an embodiment, a driving circuit DC for providing an electrical signal or power wiring (not shown) for providing a voltage may also be arranged in the middle display area MDA. In an embodiment, the driving circuit DC may pass through the middle display area MDA and may be arranged along the peripheral area PA. In this case, the third pixels PX3 arranged in the middle display area MDA may overlap the driving circuit DC or the power wiring. In another embodiment, the third pixels PX3 may not overlap the driving circuit DC or the power wiring. In this case, the driving circuit DC may be arranged along the peripheral area PA. In another embodiment, the driving circuit DC may be arranged on a boundary between the middle display area MDA and the round display area CDA. In another embodiment, the driving circuit DC may be arranged to overlap the second pixels PX2 of the round display area CDA. For convenience of explanation, a case where the driving circuit DC is arranged on the boundary between the middle display area MDA and the round display area CDA will now be focused on and described in detail.

In this case, a round pixel circuit that is connected to the round display element of the round display area CDA and controls the round display element may be arranged in the middle display area MDA. A middle pixel circuit that is connected to the middle display element of the middle display area MDA and controls the middle display element may also be arranged in the middle display area MDA.

At least one of the side display area SDA, the round display area CDA, and the middle display area MDA may be bent. In this case, the first side display area SDA1 of the side display area SDA may be bent with a first radius of curvature, and the second side display area SDA2 of the side display area SDA may be bent with a second radius of curvature. When the first radius of curvature is greater than the second radius of curvature, the radius of curvature with which the round display area CDA is bent may gradually decrease from the first side display area SDA1 to the second side display area SDA2.

When the round display area CDA is bent, a compressive strain may be generated more greatly than a tensile strain in the round display area CDA. In this case, a shrinkable substrate and a shrinkable multi-layered structure need to be applied to the round display area CDA. Accordingly, the shape of a stack of multiple layers or a substrate 100 arranged in the round display area CDA may be different from that of a stack of multiple layers or a substrate 100 arranged in the main display area FDA.

Figure 4B:
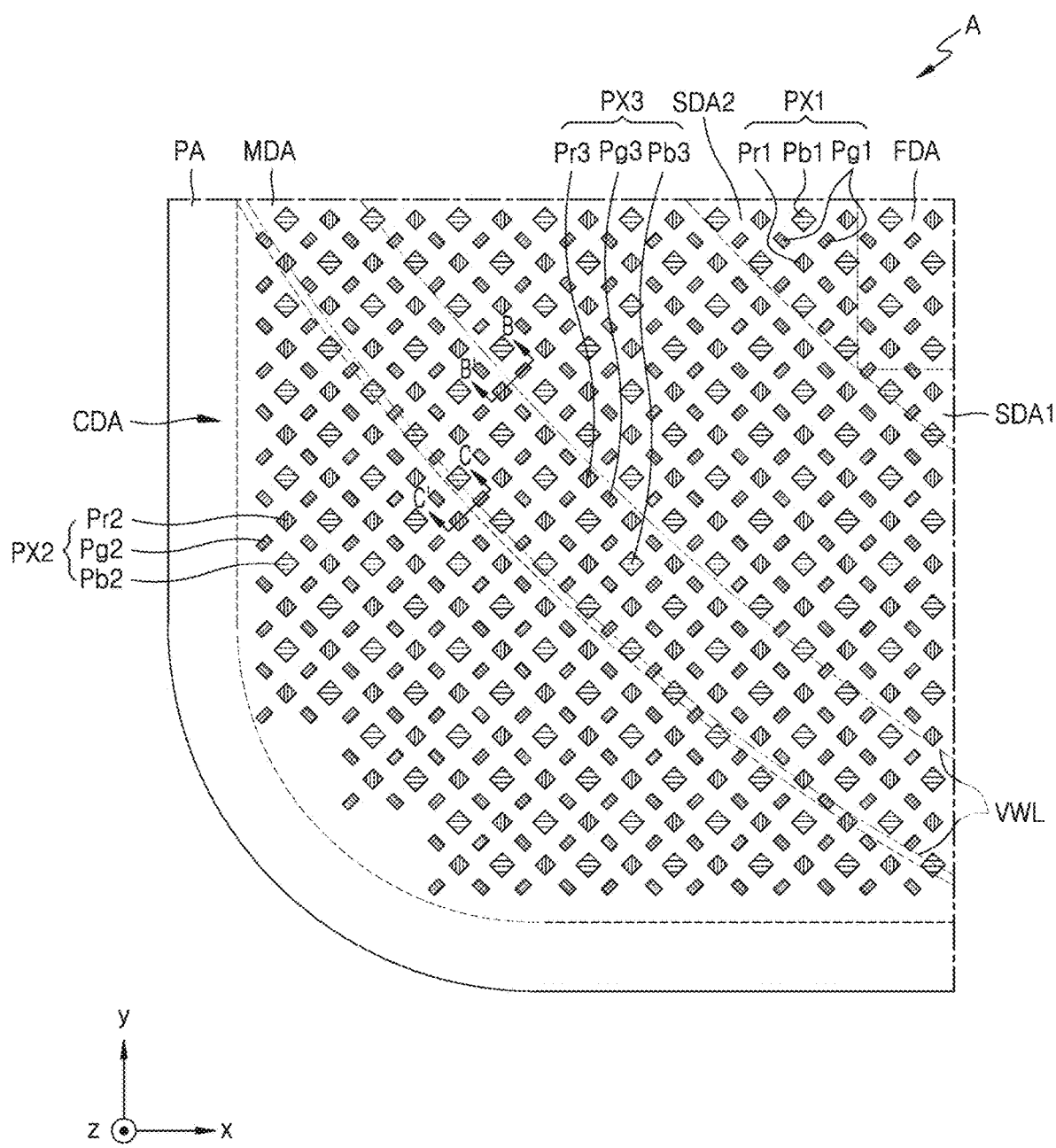
FIG. 4B is a magnified view of a portion of the display panel of FIG. 4A.

FIG. 4B is a magnified view of a portion A of the display panel 10 of FIG. 4A.

Referring to FIG. 4B, a plurality of first pixels PX1 may be arranged in the main display area FDA and/or the side display area SDA. Each of the plurality of first pixels PX1 may include a first red subpixel Pr1, a first green subpixel Pg1, and a first blue subpixel Pb1. In an embodiment, the first pixel PX1 includes subpixels arranged in a PenTile configuration. In this case, one first red subpixel Pr1, two first green subpixels Pg1, and one first blue subpixel Pb1 may constitute one first pixel PX1. Each of the first red subpixel Pr1, the first green subpixel Pg1, and the first blue subpixel Pb1 may correspond to a first main display element, a second main display element, and a third main display element.

A plurality of second pixel pixels PX2 may be arranged in the round display area CDA, and a plurality of third pixels PX3 may be arranged in the middle display area MDA. Each of the plurality of second pixels PX2 may include a second red subpixel Pr2, a second green subpixel Pg2, and a second blue subpixel Pb2. Each of the second red subpixel Pr2, the second green subpixel Pg2, and the second blue subpixel Pb2 may correspond to a first round display element, a second round display element, and a third round display element. Each of the plurality of third pixels PX3 may include a third red subpixel Pr3, a third green subpixel Pg3, and a third blue subpixel Pb3. Each of the third red subpixel Pr3, the third green subpixel Pg3, and the third blue subpixel Pb3 may correspond to a first middle display element, a second middle display element, and a third middle display element. Although a plurality of third pixels PX3 are arranged in one column along the middle display area MDA in FIG. 4B, the plurality of third pixels PX3 may be also arranged near the side of the round display area CDA and/or the main display area FDA and thus may be arranged in a plurality of columns.

In an embodiment, the second pixels PX2 and the third pixels PX3 may be arranged in the same configuration as the configuration in which the first pixels PX1 are arranged.

Each of the second pixels PX2 and the third pixels PX3 may include subpixels. Each of the second pixels PX2 may include one second red subpixel Pr2, two second green subpixels Pg2, and one second blue subpixel Pb2. Each of the third pixels PX3 may include one third red subpixel Pr3, two third green subpixels Pg3, and one third blue subpixel Pb3.

Because a planar area of the second pixel PX2 is the same as a planar area of the third pixel PX3, an image quality difference that may be generated between the round display area CDA and the middle display area MDA may be removed or minimized.

Voltage wiring VWL may be arranged in the middle display area MDA disposed between the round display area CDA and the main display area FDA. At least one of the third pixels PX3 arranged in the middle display area MDA may overlap the voltage wiring VWL. In this case, because pixels may also be arranged in the area where the voltage wiring VWL is arranged, the area may be used as the display area DA. The voltage wiring VWL may be initializing voltage lines and/or common voltage lines. An initializing voltage, a common voltage, or the like may be applied to the voltage wiring VWL.

In an embodiment, the second pixels PX2 arranged in the round display area CDA may be electrically connected to the round pixel circuit arranged in the middle display area MDA. The third pixels PX3 arranged in the middle display area MDA may be electrically connected to the middle pixel circuit arranged in the middle display area MDA.

In the second pixels PX2 and the third pixels PX3, some of the subpixels arranged in each second pixel PX2 and some of the subpixels arranged in each third pixel PX3 may be connected to each other and may simultaneously emit light beams. In an embodiment, a plurality of second red subpixels Pr2 adjacent to each other and different from each other may be connected to each other and may simultaneously emit light beams, a plurality of second green subpixels Pg2 adjacent to each other and different from each other may be connected to each other and may simultaneously emit light beams, and a plurality of second blue subpixels Pb2 adjacent to each other and different from each other may be connected to each other and may simultaneously emit light beams, for example.

In this case, display elements arranged in the round display area CDA and the middle display area MDA may constitute a single group and may be repeatedly arranged. In an embodiment, the round display area CDA may include a round display element area including a plurality of round display elements that are arranged in the round display area CDA, connected to each other, and simultaneously emit light beams, for example. The round display element area may be defined in the first direction in a quadrangular shape (e.g., rectangular or square shape). When the round display element area has a quadrangular shape (e.g., rectangular shape), the round display element area may include four third round display elements (or second blue subpixels Pb2), four first round display elements (or second red subpixels Pr2), and eight second round display elements (or second green subpixels Pg2). When the round display element area has a quadrangular shape (e.g., rectangular or square shape), the round display element area may include two third round display elements (or second blue subpixels Pb2), two first round display elements (or second red subpixels Pr2), and four second round display elements (or second green subpixels Pg2).

The plurality of middle display elements arranged in the middle display area MDA may provide the same configuration as that in which the plurality of round display elements are arranged. In this case, the middle display area MDA may include a middle display element area in which middle display elements connected to each other and emitting light beams of the same color from among the plurality of middle display elements are arranged. The middle display element area may have a quadrangular shape (e.g., rectangular or square shape). In an embodiment, when the middle display element area has a quadrangular shape (e.g., rectangular shape), the middle display element area may include four third middle display elements (or third blue subpixels Pb3), four first middle display elements (or third red subpixels Pr3), and eight second middle display elements (or third green subpixels Pg3), for example. When the middle display element area has a quadrangular shape (e.g., rectangular or square shape), the middle display element area may include two third middle display elements (or second blue subpixels Pb2), two first middle display elements (or second red subpixels Pr2), and four second middle display elements (or second green subpixels Pg2).

Figure 5:
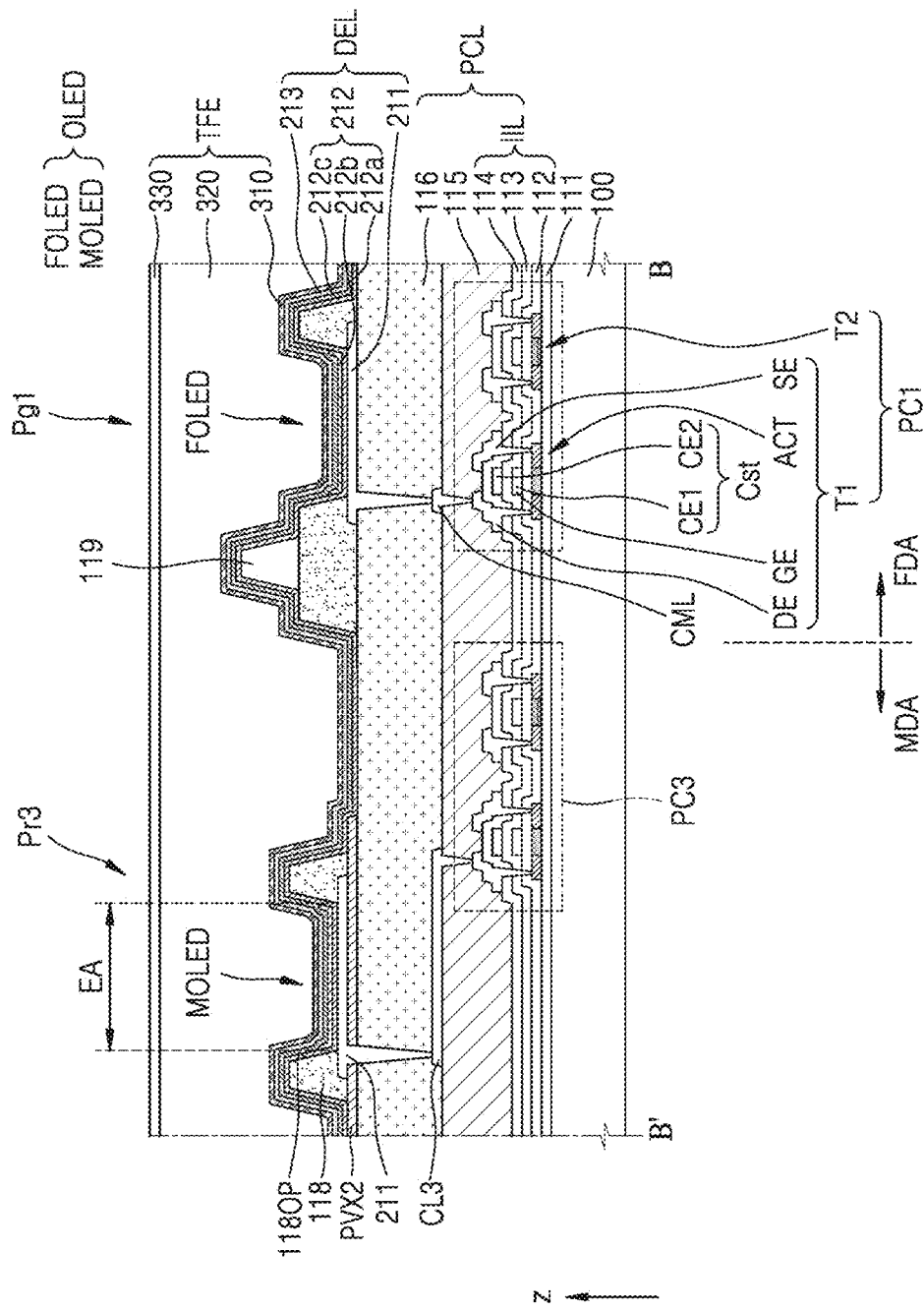
FIG. 5 is a cross-sectional view of the portion of FIG. 4A taken along line B-B' of FIG. 4B.

FIG. 5 is a cross-sectional view of the portion A taken along line B-B' of FIG. 4B.

Referring to FIG. 5, the display panel may include the substrate 100, a buffer layer 111, a pixel circuit layer PCL, an inorganic pattern layer PVX2, a display element layer DEL, and a thin-film encapsulation layer TFE.

The buffer layer 111 may be disposed on the substrate 100. The buffer layer 111 may include an inorganic insulating material, such as silicon nitride ($SiN_x$), silicon oxynitride ($SiO_xN_y$), or silicon oxide ($SiO_x$), and may be a single layer or multiple layers including the inorganic insulating material.

The pixel circuit layer PCL may be disposed on the buffer layer 111. The pixel circuit layer PCL may include pixel circuits PC. The pixel circuits PC may be disposed in the main display area FDA and the middle display area MDA. The pixel circuits PC may include a main pixel circuit PC1 arranged in the main display area FDA, and a middle pixel circuit PC3 arranged in the main display area FDA or the middle display area MDA. For convenience of description, a case where the middle pixel circuit PC3 is arranged in the middle display area MDA will now be focused on and described in detail.

The main pixel circuit PC1 may be connected to a main organic light-emitting diode FOLED, and the middle pixel circuit PC3 may be connected to a middle organic light-emitting diode MOLED through a third connection line CL3. Because the main pixel circuit PC1 and the middle pixel circuit PC3 are the same as or similar to each other, the main pixel circuit PC1 will now be focused on and described in detail.

The main pixel circuit PC1 may include a driving thin-film transistor T1, a switching thin-film transistor T2, and a storage capacitor Cst. The pixel circuit layer PCL may include an inorganic insulating layer IIL, a first insulating layer 115, and a second insulating layer 116 arranged below and/or over the components of the driving thin-film transistor T1. The inorganic insulating layer IIL may include a first gate insulating layer 112, a second gate insulating layer 113, and an inter-insulating layer 114.

The driving thin-film transistor T1 may include a semiconductor layer ACT, a gate electrode GE, a source electrode SE, and a drain electrode DE.

The semiconductor layer ACT may include polysilicon. In an alternative embodiment, the semiconductor layer ACT may include, for example, amorphous silicon, an oxide semiconductor, or an organic semiconductor. The semiconductor layer ACT may include a channel region, and a source region and a drain region respectively arranged on both sides of the channel region. The gate electrode GE may overlap the channel region.

The gate electrode GE may include a low resistance metal material. The gate electrode GE may include a conductive material including molybdenum (Mo), aluminum (Al), copper (Cu), and titanium (Ti), and may be formed or provided as a multi-layer or single layer including the aforementioned materials.

The first gate insulating layer 112 between the semiconductor layer ACT and the gate electrode GE may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 113 may be included to cover the gate electrode GE. Similar to the first gate insulating layer 112, the second gate insulating layer 113 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of the storage capacitor Cst may be disposed on the second gate insulating layer 113. The upper electrode CE2 may overlap the gate electrode GE disposed therebelow. The gate electrode GE of the driving thin-film transistor T1 and the upper electrode CE2, which overlap each other with the second gate insulating layer 113 therebetween, may constitute the storage capacitor Cst. In other words, the gate electrode GE may function as a lower electrode CE1 of the storage capacitor Cst.

Thus, the storage capacitor Cst and the driving thin-film transistor T1 may overlap each other. In an embodiment, the storage capacitor Cst and the driving thin-film transistor T1 may not overlap each other.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multi-layer including the aforementioned materials.

The inter-insulating layer 114 may cover the upper electrode CE2. The inter-insulating layer 114 may include $SiO_x$, $SiN_x$, $SiO_xN_y$, $Al_2O_3$, $TiO_2$, $Ta_2O_5$, $HfO_2$, ZnO, or the like. The inter-insulating layer 114 may be a single layer or multi-layer including the aforementioned inorganic insulating materials.

The drain electrode DE and the source electrode SE may be disposed on the inter-insulating layer 114. The drain electrodes DE and the source electrode SE may include a highly conductive material. Each of the source electrode SE and the drain electrode DE may include a conductive material including Mo, Al, Cu, and Ti, and may be a multi-layer or single layer including the aforementioned materials. In an embodiment, the drain electrodes DE and the source electrode SE may have a multi-layer structure of Ti/Al/Ti.

Similar to the driving thin-film transistor T1, the switching thin-film transistor T2 may include a semiconductor layer, a gate electrode, a source electrode, and a drain electrode.

The first insulating layer 115 may cover the drain electrode DE and the source electrode SE. The first insulating layer 115 may include an organic material. In an embodiment, the first insulating layer 115 may include an organic insulating material, such as a commercial polymer (such as polymethyl methacrylate ("PMMA") or polystyrene ("PS")), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a combination thereof, for example.

A connection electrode CML and the third connection line CL3 may be arranged on the first insulating layer 115. In this case, the connection electrode CML and the third connection line CL3 may be connected to the drain electrode DE or the source electrode SE through a contact hole of the first insulating layer 115. The connection electrode CML and the third connection line CL3 may include a highly conductive material. Each of the connection electrode CML and the third connection line CL3 may include a conductive material including Mo, Al, Cu, Ti, etc., and may be a multi-layer or single layer including the aforementioned materials. In an embodiment, the connection electrode CML may have a multi-layer structure of Ti/Al/Ti.

The third connection line CL3 may extend in one direction in the middle display area MDA.

The second insulating layer 116 may cover the connection electrode CML and the third connection line CL3. The second insulating layer 116 may include an organic insulating material. The second insulating layer 116 may include an organic insulating material, such as a commercial polymer (such as PMMA or PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a combination thereof.

The inorganic pattern layer PVX2 may be disposed on the second insulating layer 116. In detail, the inorganic pattern layer PVX2 may overlap the middle display area MDA. The inorganic pattern layer PVX2 may be a single layer or multi-layer including inorganic materials such as $SiN_x$ and/or $SiO_x$. In some embodiments, the inorganic pattern layer PVX2 may be omitted.

The display element layer DEL may be disposed on the pixel circuit layer PCL. The display element layer DEL may include an organic light-emitting diode OLED. In detail, the display element layer DEL may include the main organic light-emitting diode (also referred to as a front organic light-emitting diode) FOLED arranged in the main display area FDA and the middle organic light-emitting diode MOLED arranged in the middle display area MDA. In this case, the middle organic light-emitting diode MOLED may be disposed on the inorganic pattern layer PVX2. In this case, one main organic light-emitting diode FOLED may refer to one subpixel. One main organic light-emitting diode FOLED may be one main display element.

A pixel electrode 211 of the front organic light-emitting diode FOLED may be electrically connected to the connecting electrode CML through a contact hole of the second insulating layer 116. A pixel electrode 211 of the middle organic light-emitting diode MOLED may be electrically connected to a third connection line CL3 through a contact hole of the second insulating layer 116.

The pixel electrode 211 may include conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a combination of these materials. In another embodiment, the pixel electrode 211 may further include a film including ITO, IZO, ZnO, or $In_2O_3$ above/below the reflection layer.

A pixel defining layer 118 in which an opening 118OP exposing a center portion of the pixel electrode 211 is defined may be arranged on the pixel electrode 211. The pixel defining layer 118 may include an organic insulating material and/or an inorganic insulating material. The opening 118OP may define a light-emission area of light emitted by the organic light-emitting diode OLED (hereinafter, also referred to as a light-emission area EA). In an embodiment, a width of the opening 118OP may correspond to a width of the light-emission area EA, for example.

A spacer 119 may be disposed on the pixel defining layer 118. The spacer 119 may be included to prevent damage to the substrate 100 or a multi-layered film on the substrate 100, in a method of manufacturing a display device. In a method of manufacturing a display panel, a mask sheet may be used. In this case, the mask sheet may enter the opening 1180P of the pixel defining layer 118 or may adhere to the pixel defining layer 118. The spacer 119 may prevent a defect such as damage to or destruction of a portion of the substrate 100 and the multi-layered film by the mask sheet when a deposition material is deposited on the substrate 100.

The spacer 119 may include an organic material such as polyimide. In an alternative embodiment, the spacer 119 may include an inorganic insulating material such as silicon nitride ($SiN_x$) or silicon oxide ($SiO_x$), or may include an inorganic insulating material and an organic insulating material.

In an embodiment, the spacer 119 may include a material different from that included in the pixel defining layer 118. In another embodiment, the spacer 119 may include the same material as that included in the pixel defining layer 118. In this case, the pixel defining layer 118 and the spacer 119 may be formed or provided together in a mask process using a halftone mask or the like.

An intermediate layer 212 may be disposed on the pixel defining layer 118. The intermediate layer 212 may include an emission layer 212b arranged in the opening 1180P of the pixel defining layer 118. The emission layer 212b may include a low molecular weight or high molecular weight organic material that emits light of a predetermined color.

A first functional layer 212a and a second functional layer 212c may be arranged below and above the emission layer 212b, respectively. The first functional layer 212a may include a hole transport layer ("HTL"), or may include an HTL and a hole injection layer ("HIL"). The second functional layer 212c is a component arranged above the emission layer 212b, and is optional. The second functional layer 212c may include an electron transport layer ("ETL") and/or an electron injection layer ("EIL"). The first functional layer 212a and/or the second functional layer 212c may be a common layer that covers the entire surface of the substrate 100, similar to an opposite electrode 213 to be described later.

The opposite electrode 213 may include a conductive material having a low work function. In an embodiment, the opposite electrode 213 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials, for example. In an alternative embodiment, the opposite electrode 213 may further include a layer, such as ITO, IZO, ZnO, or $In_2O_3$, on the (semi)transparent layer including any of the above-described materials.

In some embodiments, a capping layer (not shown) may be further arranged on the opposite electrode 213. The capping layer may include lithium fluoride (LiF), an inorganic material, or/and an organic material.

Figure 7:
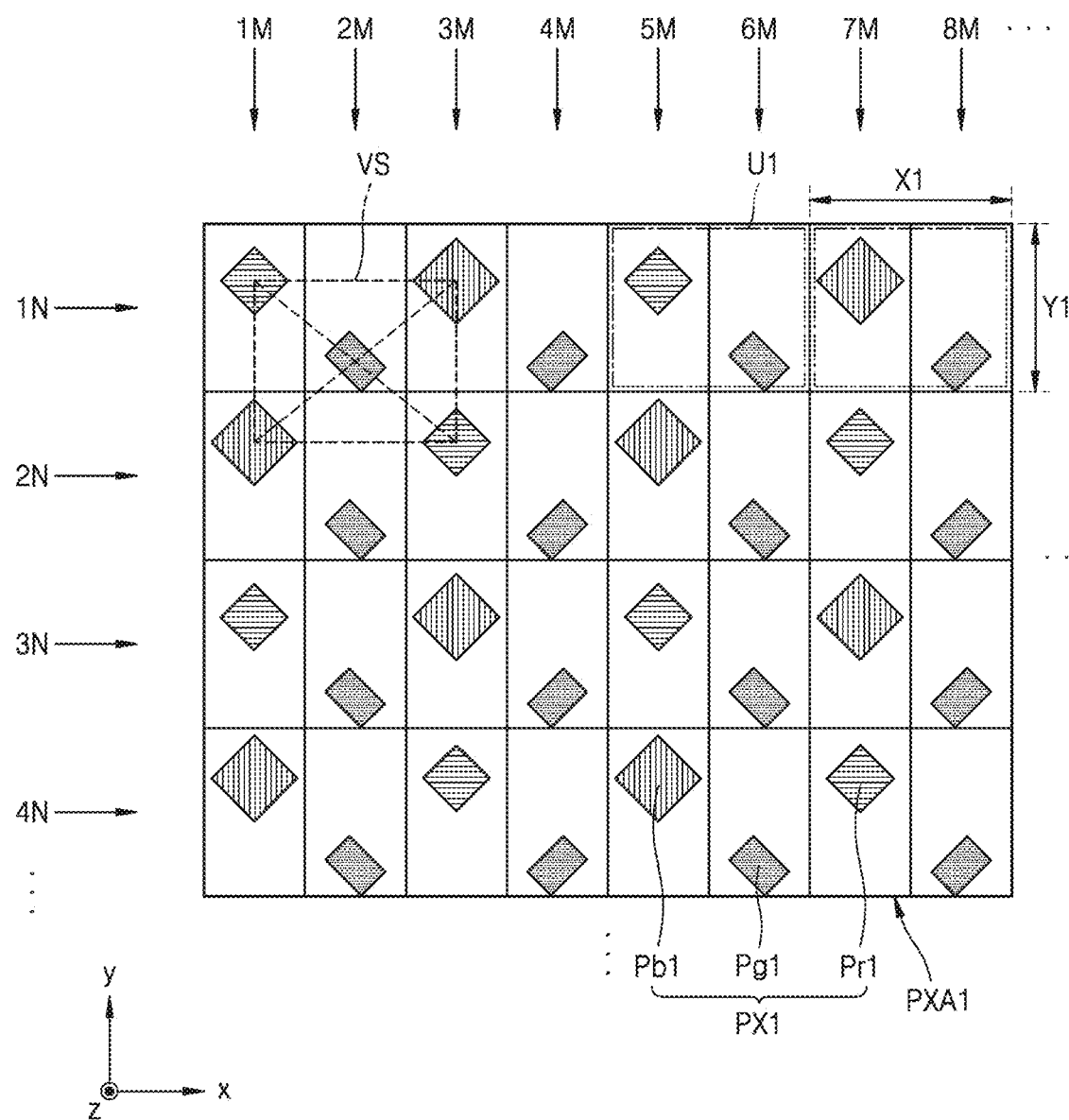
FIG. 7 is a plan view of an embodiment of an arrangement of pixels of a main display area of a display panel according to the invention.

The thin-film encapsulation layer TFE may be disposed on the opposite electrode 213. In an embodiment, the thin-film encapsulation layer TFE may include at least one inorganic encapsulation layer and at least one organic encapsulation layer. In an embodiment, FIG. 7 illustrates the thin-film encapsulation layer TFE including a first inorganic encapsulation layer 310, an organic encapsulation layer 320, and a second inorganic encapsulation layer 330 sequentially stacked on each other.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy-based resin, polyimide, or polyethylene. In an embodiment, the organic encapsulation layer 320 may include acrylate.

Although not shown in the drawings, a touch electrode layer may be arranged on the thin-film encapsulation layer TFE, and an optical functional layer may be arranged on the touch electrode layer. The touch electrode layer may obtain coordinate information based on an external input, for example, a touch event. The optical functional layer may reduce reflectance of light (external light) externally incident toward the display device, and/or may improve color purity of light emitted by the display device. In an embodiment, the optical functional layer may include a phase retarder and/or a polarizer. The phase retarder may be of a film type or liquid coating type, and may include a $\lambda/2$ phase retarder and/or a $\lambda/4$ phase retarder. The polarizer may also be of a film type or liquid coating type. The film type may include a stretchable synthetic resin film, and the liquid coating type may include liquid crystals arranged in a predetermined arrangement. The phase retarder and the polarizer may further include protective films, respectively.

In another embodiment, the optical functional layer may include a black matrix and color filters. The color filters may be arranged by taking into account the colors of light beams respectively emitted by the pixels of the display device. Each of the color filters may include a pigment or dye of a red, green, or blue color. In an alternative embodiment, each of the color filters may further include quantum dots in addition to the above-described pigment or dye. In an alternative embodiment, some of the color filters may not include the above-described pigment or dye, and may include scattered particles such as titanium oxide.

In another embodiment, the optical functional layer may include a destructive interference structure. The destructive interference structure may include a first reflection layer and a second reflection layer arranged in different layers. First reflected light and second reflected light respectively reflected by the first reflection layer and the second reflection layer may destructively interfere with each other, and thus the reflectance of external light may be reduced.

An adhesion member may be disposed between the touch electrode layer and the optical functional layer. The adhesion member may employ a general adhesion member known to the art without limitation. The adhesion member may be a pressure sensitive adhesive ("PSA").

Figure 6:
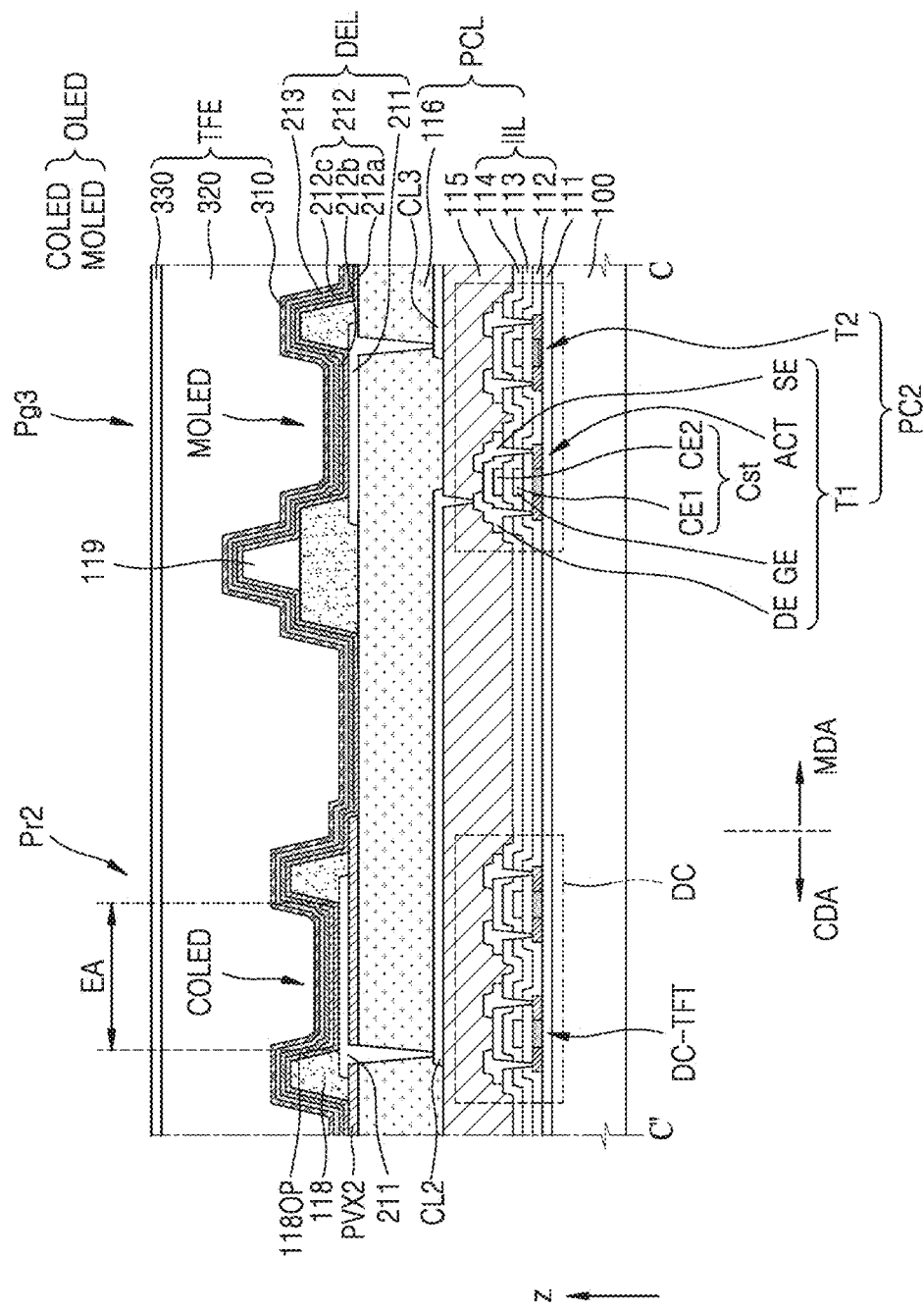
FIG. 6 is a cross-sectional view of the portion of FIG. 4A taken along line C-C' of FIG. 4B.

FIG. 6 is a cross-sectional view of the portion A taken along line C-C' of FIG. 4B.

Referring to FIG. 6, a display panel may include the middle display area MDA and the round display area CDA. The display panel may be similar to that described above with reference to FIG. 5. Differences between the display panels of FIGS. 5 and 6 will now be focused on and described in detail.

The middle display area MDA and the round display area CDA may be adjacent to each other. In this case, a round pixel circuit PC2 connected to a round organic light-emitting diode COLED arranged in the round display area CDA through a second connection line CL2, and the middle pixel circuit PC3 of FIG. 5 connected to the middle organic light-emitting diode MOLED arranged in the middle display area MDA through the third connection line CL3 may be arranged in the middle display area MDA. A driving circuit DC may be arranged in the middle display area MDA or the round display area CDA. For convenience of explanation, a case where the driving circuit DC is arranged in the round display area CDA will now be focused on and described in detail. In this case, the round pixel circuit PC2 may be the same as or similar to the main pixel circuit PC1 and the middle pixel circuit PC3 described above with reference to FIG. 5.

The pixel circuit layer PCL including the driving circuit DC, the round pixel circuit PC2, and the middle pixel circuit PC3 may be arranged on the buffer layer 111.

The driving circuit DC may include a driving circuit thin-film transistor DC-TFT. In an embodiment, the driving circuit DC may be connected to a scan line. The pixel circuit PC may include a driving thin-film transistor T1, a switching thin-film transistor T2, and a storage capacitor Cst.

In this case, the second connection line CL2 may overlap the driving circuit thin-film transistor DC-TFT. Similar to the driving thin-film transistor T1, the driving circuit thin-film transistor DC-TFT may include a semiconductor layer, a gate electrode, a source electrode, and a drain electrode.

In this case, the round organic light-emitting diode COLED arranged in the round display area CDA may be connected to the round pixel circuit PC2 arranged in the middle display area MDA through the second connection line CL2. The middle organic light-emitting diode MOLED arranged in the middle display area MDA may be connected to a third pixel circuit PC2-3 arranged in the middle display area MDA through the third connection line CL3.

In this case, the driving circuit DC may be arranged under the round organic light-emitting diode COLED or may be arranged between the round organic light-emitting diode COLED and the middle organic light-emitting diode MOLED arranged in the middle display area MDA.

FIG. 7 is a plan view of an embodiment of an arrangement of pixels of a main display area of a display panel according to the invention.

Referring to FIG. 7, a plurality of first pixels PX1 may be arranged in the main display area FDA. Each first pixel PX1 may include a plurality of subpixels each of which is a minimum unit that realizes an image. Each subpixel may be defined as an emission area where a main display element (or a main organic light-emitting diode) emits light. Accordingly, an arrangement of the subpixels described below may be similar to or substantially the same as an arrangement of main display elements.

In an embodiment, each of the plurality of first pixels PX1 may include a first red subpixel Pr1, a first green subpixel Pg1, and a first blue subpixel Pb1. The first red subpixel Pr1, the first green subpixel Pg1, and the first blue subpixel Pb1 may emit light beams of a red color, a green color, and a blue color, respectively.

In an embodiment, the main display area FDA may be divided into a plurality of subpixel areas PXA. One subpixel may be arranged in each subpixel area PXA1. Although one subpixel area PXA has a quadrangular planar shape (e.g., rectangular planar shape), embodiments of the invention are not limited thereto. One subpixel area PXA may have a shape of a polygon such as a triangle, a square, or a pentagon.

Although not shown in the drawings, a main pixel circuit PC1 connected to one subpixel may be arranged in each subpixel area PXA1. In this case, the main pixel circuit PC1 may be arranged in the same direction as the direction in which a longer edge of each subpixel area PXA is arranged, and one main pixel circuit PC1 may be arranged within each subpixel area PXA1. In another embodiment, the main pixel circuit PC1 may define a predetermined angle with the longer edge of the subpixel area PXA and thus may be arranged over a subpixel area PXA1 adjacent to the former subpixel area PXA1.

Two subpixel areas PXA1 may constitute one main unit area U1. In this case, in a plan view, the first red subpixel Pr1 and the first green subpixel Pg1 may be arranged in the main unit area U1, or the first green subpixel Pg1 and the first blue subpixel Pb1 may be arranged in the main unit area U1. Main pixel circuits PC1 respectively connected to the subpixels arranged in the main unit area U1 may be arranged in the main unit area U1. In this case, in a plan view, two subpixels and two main pixel circuits PC1 may be arranged in the main unit area U1. The main unit area U1 may include a first width X1 in the second direction and a second width Y1 in the first direction, and may have a quadrangular shape (e.g., rectangular or square shape).

The plurality of subpixel areas PXA may be arranged in a matrix configuration. In an embodiment, the plurality of subpixel areas PXA may be two-dimensionally arranged in a row direction (e.g., the x direction) and a column direction (e.g., the y direction). FIG. 7 illustrates a plurality of subpixel areas PXA arranged in a first row 1N through to a fourth row 4N sequentially adjacent to each other and in a first column 1M to an eighth column 8M sequentially adjacent to each other. The numbers of rows and columns in which the subpixel areas PXA are arranged may be determined according to a resolution and a design of the display device 1.

In an embodiment, a first red subpixel Pr1, a first green subpixel Pg1, a first blue subpixel Pb1, and another first green subpixel Pg1 may be arranged alternately with each other in the first row 1N, and this arrangement may be repeated. The first red subpixels Pr1, the first green subpixels Pg1, and the first blue subpixels Pb1 may be spaced apart from each other at predetermined intervals and may be arranged in a zigzag configuration in the row direction. A first blue subpixel Pb1, a first red subpixel Pr1, a first green subpixel Pg1, and another first green subpixel Pg1 may be arranged alternately with each other in the second row 2N, and this arrangement may be repeated. The first blue subpixels Pb1, the first green subpixels Pg1, and the first red subpixels Pr1 may be spaced apart from each other at predetermined intervals and may be arranged in a zigzag configuration in the row direction. A subpixel arrangement in a third row 3N may be substantially the same as that in the first row 1N, and a subpixel arrangement in a fourth row 4N may be substantially the same as that in the second row 2N. These subpixel arrangements may be repeated to an n-th row (where n is a predefined natural number).

In an embodiment, first red subpixels Pr1 and first blue subpixels Pb1 may be arranged alternately with each other in a first column 1M, and this arrangement may be repeated. The first red subpixels Pr1 and the first blue subpixels Pb1 may be arranged with a predetermined interval from each other. First green subpixels Pg1 may be arranged with a predetermined interval from each other in a second column 2M. A subpixel arrangement in a third column 3M may be substantially the same as that in the first column 1M, and a subpixel arrangement in a fourth column 4M may be substantially the same as that in the second column 2M. These subpixel arrangements may be repeated to an m-th row (where m is a predefined natural number and may be the same as or different from n).

For example, the first blue subpixel Pb1 and the first red subpixel Pr1 may be larger than the first green subpixel Pg1, and the first blue subpixel Pb1 may be larger than the first red subpixel Pr1.

Describing this subpixel arrangement structure differently, first red subpixels Pr1 may be arranged at first and third facing vertexes of the four vertexes of a virtual quadrilateral VS having a center point of a first green subpixel Pg1 as its center point, and first blue subpixels Pb1 may be arranged at the remaining vertexes. The virtual quadrilateral VS may be a rectangle, a rhombus, a square, or the like.

By applying rendering in which a color of a subpixel is expressed by sharing the colors of its adjacent subpixels through the above-described subpixel layout structure, a high resolution may be obtained via a small number of subpixels.

Although the subpixel arrangement of FIG. 7 is an example, embodiments of the invention are not limited thereto. In an embodiment, a plurality of subpixels may be arranged in various configurations, such as a stripe structure, a mosaic arrangement structure, and a delta arrangement structure.

Figure 8A:
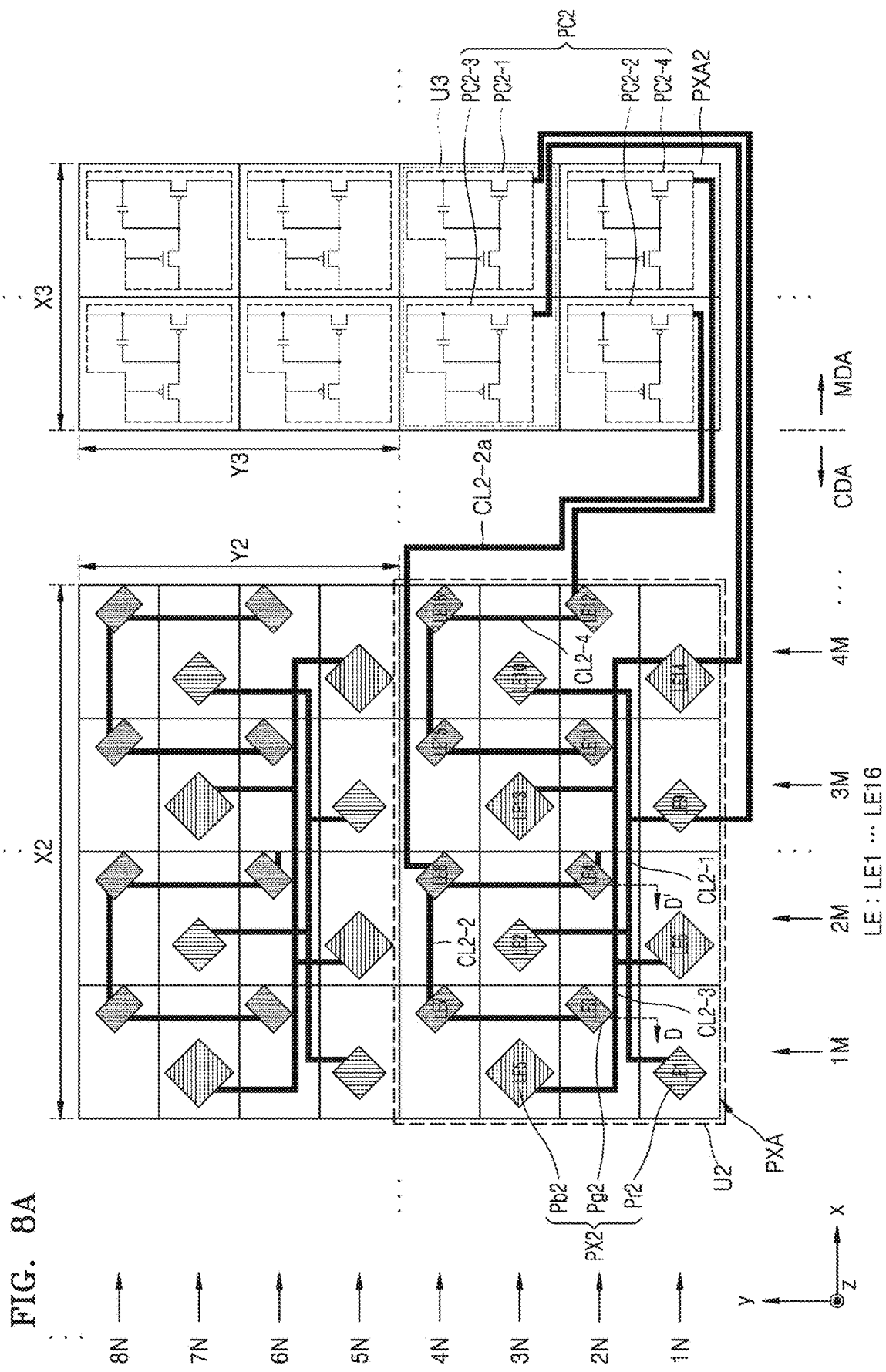
FIG. 8A is a plan view of an embodiment of arrangement and connection of pixels of a round display area of a display panel according to the invention.

FIG. 8A is a plan view of an embodiment of arrangement and connection of pixels of a round display area of a display panel according to the invention.

Referring to FIG. 8A, second pixels PX2 and third pixels (not shown) each including a plurality of subpixels may be arranged in each of the round display area CDA and the middle display area MDA. In this case, the round display area CDA and the middle display area MDA may have the same subpixel layouts or similar subpixel layouts. In this case, round pixel circuits PC2 may not be arranged in the round display area CDA, and round pixel circuits PC2 and middle pixel circuits (not shown) may be arranged in the middle display area MDA. For convenience of description, subpixels arranged in the round display area CDA and a round pixel circuit PC2 arranged in the middle display area MDA will now be described in detail. In this case, the round pixel circuit PC2 may include a first pixel circuit PC2-1, a second pixel circuit PC2-2, a third pixel circuit PC2-3, and a fourth pixel circuit PC2-4.

Sixteen subpixel areas PXA may constitute a single round display element area U2. In this case, the single round display element area U2 may be a set of subpixel areas PXA arranged in four rows and four columns, and may include the components arranged in the sixteen subpixel areas PXA. In an embodiment, the round display element area U2 may include sixteen display elements, namely, first through sixteenth display elements LE1 through LE16. FIG. 8A illustrates two round display element areas U2, for example. One round display element area U2 will now be focused on and described in detail.

In an embodiment, the first pixel circuit PC2-1 may commonly drive not only the first display element LE1 and the second display element LE2 but also the ninth display element LE9 and the tenth display element LE10. In other words, the first display element LE1, the second display element LE2, the ninth display element LE9, and the tenth display element LE10 may be commonly driven (or controlled) by one pixel circuit, for example, the first pixel circuit PC2-1.

In an embodiment, the first display element LE1, the second display element LE2, the ninth display element LE9, and the tenth display element LE10 may be arranged in different rows, for example. In an embodiment, the first display element LE1 may be arranged in a first row 1N, the second display element LE2 may be arranged in a second row 2N, the ninth display element LE9 may be arranged in a third row 3N, and the tenth display element LE10 may be arranged in a fourth row 4N, for example. In an embodiment, the first display element LE1 and the second display element LE2 may be arranged in different columns, and the ninth display element LE9 and the tenth display element LE10 may be arranged in different columns, for example. In an embodiment, the first display element LE1 and the ninth display element LE9 may be arranged in the first row N1, and the second display element LE2 and the tenth display element LE10 may be arranged in the third row N3, for example.

In an embodiment, a plurality of display elements LE that are commonly driven by one pixel circuit PC may be electrically connected to one another. In an embodiment, the first display element LE1, the second display element LE2, the ninth display element LE9, and the tenth display element LE10 may be electrically connected to one another. To this end, according to some embodiments, a first conductive layer CL2-1 electrically connecting the first display element LE1, the second display element LE2, the ninth display element LE9, and the tenth display element LE10 to one another may be included. The first conductive layer CL2-1 may be electrically connected to the first pixel circuit PC2-1, for example. In a plan view, the first conductive layer CL2-1 may extend from the first display element LE1 to the second display element LE2, the ninth display element LE9, and the tenth display element LE10. In another embodiment, pixel electrodes of the first display element LE1, the second display element LE2, the ninth display element LE9, and the tenth display element LE10 may be unitary with one another, so that the first display element LE1, the second display element LE2, the ninth display element LE9, and the tenth display element LE10 may be electrically connected to one another.

In an embodiment, the second pixel circuit PC2-2 may commonly drive not only the third display element LE3 and the fourth display element LE4 but also the seventh display element LE7 and the eighth display element LE8. In other words, the third display element LE3, the fourth display element LE4, the seventh display element LE7, and the eighth display element LE8 may be commonly driven (or controlled) by one pixel circuit, for example, the second pixel circuit PC2-2.

In an embodiment, the third display element LE3 and the fourth display element LE4 may be arranged in different columns, and the seventh display element LE7 and the eighth display element LE8 may be arranged in different columns, for example. In an embodiment, the third display element LE3 and the seventh display element LE7 may be arranged in a first column 1M, and the fourth display element LE4 and the eighth display element LE8 may be arranged in a second column M2, for example. In an embodiment, the third display element LE3 and the seventh display element LE7 may be arranged in different rows, and the fourth display element LE4 and the eighth display element LE8 may be arranged in different rows, for example. In an embodiment, the third display element LE3 and the fourth display element LE4 may be arranged in the second row 2N, and the seventh display element LE7 and the eighth display element LE8 may be arranged in the fourth row 4N, for example.

In an embodiment, a plurality of display elements LE that are commonly driven by one pixel circuit PC may be electrically connected to one another. In an embodiment, the third display element LE3, the fourth display element LE4, the seventh display element LE7, and the eighth display element LE8 may be electrically connected to one another, for example. To this end, according to some embodiments, a second conductive layer CL2-2 electrically connecting the third display element LE3, the fourth display element LE4, the seventh display element LE7, and the eighth display element LE8 to one another may be included. The second conductive layer CL2-2 may be electrically connected to the second pixel circuit PC2-2. In a plan view, the second conductive layer CL2-2 may extend from the third display element LE3 to the fourth display element LE4, the seventh display element LE7, and the eighth display element LE8. In a plan view, the second conductive layer CL2-2 may extend from one of the third display element LE3, the fourth display element LE4, the seventh display element LE7, and the eighth display element LE8 to the second pixel circuit PC2-2. In another embodiment, pixel electrodes of the first display element LE1, the second display element LE2, the ninth display element LE9, and the tenth display element LE10 may be unitary with one another, so that the first display element LE1, the second display element LE2, the ninth display element LE9, and the tenth display element LE10 may be electrically connected to one another.

In an embodiment, the third pixel circuit PC2-3 may commonly drive not only the fifth display element LE5 and the sixth display element LE6 but also the thirteenth display element LE13 and the fourteenth display element LE14. In other words, the fifth display element LE5, the sixth display element LE6, the thirteenth display element LE13, and the fourteenth display element LE14 may be commonly driven (or controlled) by one pixel circuit, for example, the third pixel circuit PC2-3.

In an embodiment, the fifth display element LE5, the sixth display element LE6, the thirteenth display element LE13, and the fourteenth display element LE14 may be arranged in different columns, for example. In an embodiment, the fifth display element LE5 may be arranged in the first column 1M, the sixth display element LE6 may be arranged in the second column 2M, the thirteenth display element LE13 may be arranged in the third column 3M, and the fourteenth display element LE14 may be arranged in the fourth column 4M, for example. In an embodiment, the fifth display element LE5 and the sixth display element LE6 may be arranged in different rows, and thirteenth display element LE13 and the fourteenth display element LE14 may be arranged in different rows, for example. In an embodiment, the fifth display element LE5 and the thirteenth display element LE13 may be arranged in the third row 3N, and the sixth display element LE6 and the fourteenth display element LE14 may be arranged in the first row 1N, for example.

In an embodiment, a plurality of display elements LE that are commonly driven by one pixel circuit PC may be electrically connected to one another. In an embodiment, the fifth display element LE5, the sixth display element LE6, the thirteenth display element LE13, and the fourteenth display element LE14 may be electrically connected to one another, for example. To this end, according to some embodiments, a third conductive layer CL2-3 electrically connecting the fifth display element LE5, the sixth display element LE6, the thirteenth display element LE13, and the fourteenth display element LE14 to one another may be included. The third conductive layer CL2-3 may be electrically connected to the third pixel circuit PC2-3. In a plan view, the third conductive layer CL2-3 may extend from the fifth display element LE5 to the sixth display element LE6, the thirteenth display element LE13, and the fourteenth display element LE14. In another embodiment, pixel electrodes of the fifth display element LE5, the sixth display element LE6, the thirteenth display element LE13, and the fourteenth display element LE14 may be unitary with one another, so that the fifth display element LE5, the sixth display element LE6, the thirteenth display element LE13, and the fourteenth display element LE14 may be electrically connected to one another.

In an embodiment, the fourth pixel circuit PC2-4 may commonly drive the eleventh display element LE11, the twelfth display element LE12, the fifteenth display element LE15, and the sixteenth display element LE16. In other words, the eleventh display element LE11, the twelfth display element LE12, the fifteenth display element LE15, and the sixteenth display element LE16 may be commonly driven (or controlled) by one pixel circuit, for example, the fourth pixel circuit PC2-4.

In an embodiment, the eleventh display element LE11 and the twelfth display element LE12 may be arranged in different columns, the fifteenth display element LE15 and the sixteenth display element LE16 may be arranged in different columns, for example. In an embodiment, the eleventh display element LE11 and the fifteenth display element LE15 may be arranged in the third column 3M, and the twelfth display element LE12 and the sixteenth display element LE16 may be arranged in the fourth column M4, for example. In an embodiment, the eleventh display element LE11 and the fifteenth display element LE15 may be arranged in different rows, the twelfth display element LE12 and the sixteenth display element LE16 may be arranged in different rows, for example. In an embodiment, the eleventh display element LE11 and the twelfth display element LE12 may be arranged in the second row N2, and the fifteenth display element LE15 and the sixteenth display element LE16 may be arranged in the fourth row N4, for example.

In an embodiment, a plurality of display elements LE that are commonly driven by one pixel circuit PC may be electrically connected to one another. In an embodiment, the eleventh display element LE11, the twelfth display element LE12, the fifteenth display element LE15, and the sixteenth display element LE16 may be electrically connected to one another, for example. To this end, according to some embodiments, a fourth conductive layer CL2-4 electrically connecting the eleventh display element LE11, the twelfth display element LE12, the fifteenth display element LE15, and the sixteenth display element LE16 to one another may be included. The fourth conductive layer CL2-4 may be electrically connected to the fourth pixel circuit PC2-4. In a plan view, the fourth conductive layer CL2-4 may extend from the eleventh display element LE11 to the twelfth display element LE12, the fifteenth display element LE15, and the sixteenth display element LE16. In another embodiment, pixel electrodes of the eleventh display element LE11, the twelfth display element LE12, the fifteenth display element LE15, and the sixteenth display element LE16 may be unitary with one another, so that the eleventh display element LE11, the twelfth display element LE12, the fifteenth display element LE15, and the sixteenth display element LE16 may be electrically connected to one another.

In an embodiment, the first display element LE1, the second display element LE2, the ninth display element LE9, and the tenth display element LE10 may emit light of the same color, namely, a first color. The third display element LE3, the fourth display element LE4, the seventh display element LE7, and the eighth display element LE8 may emit light of the same color, namely, a second color, and the second color may be different from the first color. The fifth display element LE5, the sixth display element LE6, the thirteenth display element LE13, and the fourteenth display element LE14 may emit light of the same color, namely, a third color, and the third color may be different from the second color. In an embodiment, the eleventh display element LE11, the twelfth display element LE12, the fifteenth display element LE15, and the sixteenth display element LE16 may emit light of the same color, namely, the second color, for example. Each of the first through third colors may be one of red, green, and blue, or may be one of red, green, blue, and white. In an embodiment, the first color may be red, the second color may be green, and the third color may be blue, for example.

Although not shown in FIG. 8A, in an embodiment, one scan line may be commonly electrically connected to the first, second, third, and fourth pixel circuits PC2-1, PC2-2, PC2-3, and PC2-4, and thus the first, second, third, and fourth pixel circuits PC2-1, PC2-2, PC2-3, and PC2-4 may commonly receive a scan signal from the one scan line. Accordingly, only one scan line may be used to drive the display elements LE arranged in four rows.

The first conductive layer CL2-1, the second conductive layer CL2-2, the third conductive layer CL2-3, and the fourth conductive layer CL2-4 may serve as the second connection line CL2 of FIG. 6. In this case, at least one of the first conductive layer CL2-1, the second conductive layer CL2-2, the third conductive layer CL2-3, and the fourth conductive layer CL2-4 may extend to each pixel circuit and thus may be connected to each pixel circuit, or may be connected to each pixel circuit through a separate connection conductive layer.

Figure 8B:
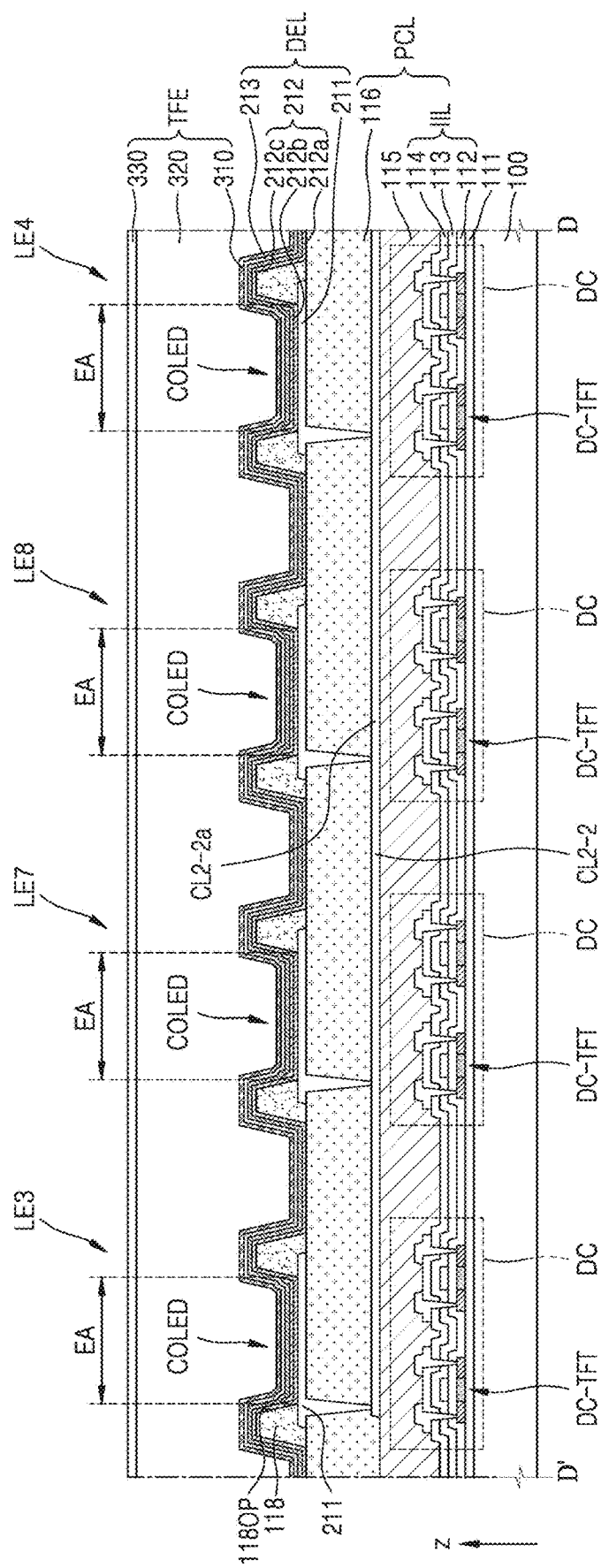
FIG. 8B is a cross-sectional view taken along line D-D' of FIG. 8A.
Figure 8C:
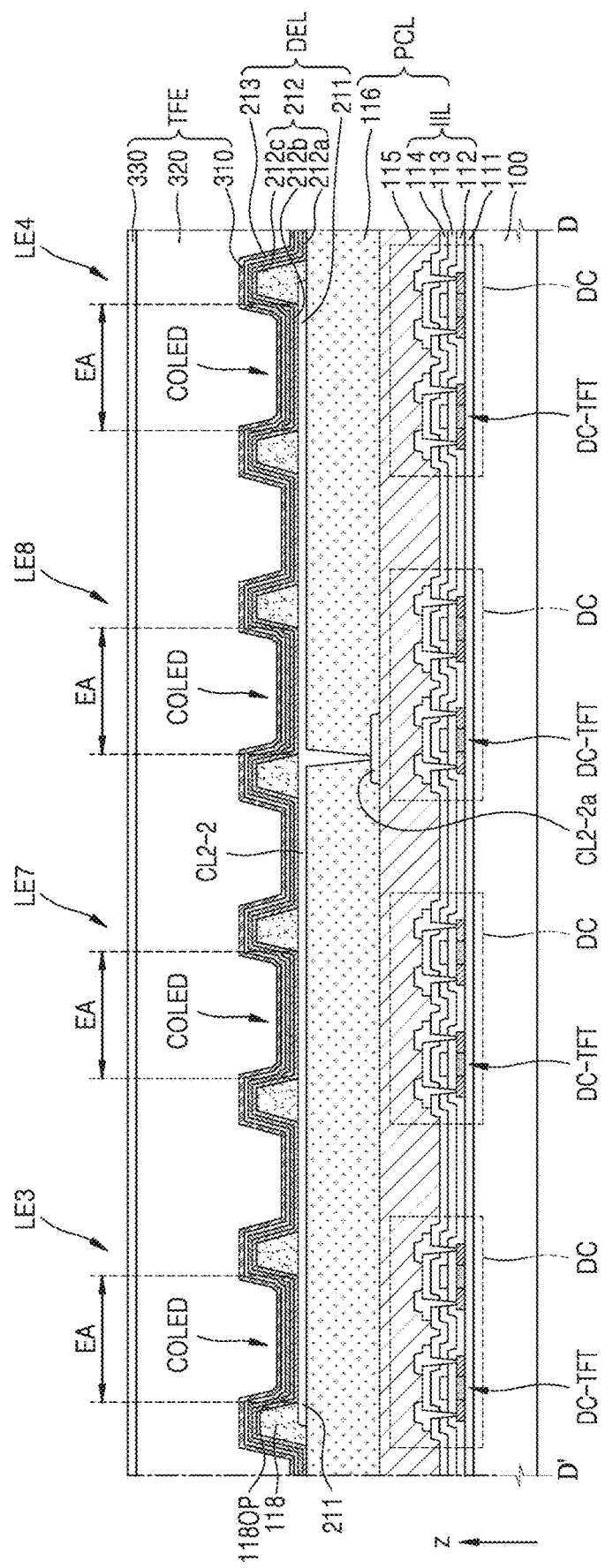
FIG. 8C is a cross-sectional view taken along line D-D' of FIG. 8A.
Figure 8D:
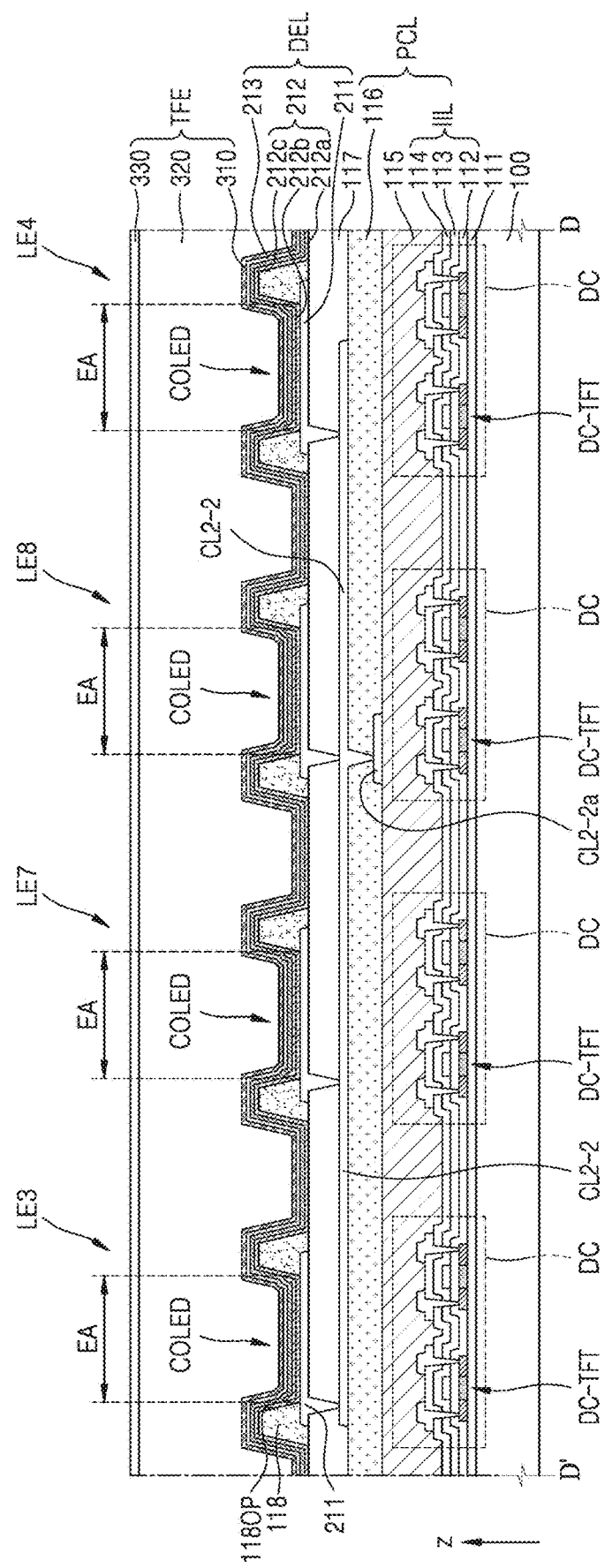
FIG. 8D is a cross-sectional view taken along line D-D' of FIG. 8A.

The first conductive layer CL2-1, the second conductive layer CL2-2, the third conductive layer CL2-3, and the fourth conductive layer CL2-4 may be arranged in the same manner as or a similar manner to that shown in FIGS. 8B through 8D. In this case, the first conductive layer CL2-1, the second conductive layer CL2-2, the third conductive layer CL2-3, and the fourth conductive layer CL2-4 may not intersect one another or may not be electrically connected to one another when being arranged in the same layer. The first conductive layer CL2-1, the second conductive layer CL2-2, the third conductive layer CL2-3, and the fourth conductive layer CL2-4 may not be electrically connected to one another by being arranged in different layers. In the above case, connection conductive layers respectively connected to the first conductive layer CL2-1, the second conductive layer CL2-2, the third conductive layer CL2-3, and the fourth conductive layer CL2-4 may not be electrically connected to one another, like the first conductive layer CL2-1, the second conductive layer CL2-2, the third conductive layer CL2-3, and the fourth conductive layer CL2-4.

The order of the first through fourth pixel circuits PC2-1 through PC2-4 is not limited to the above-described order, and the order may vary or the locations of the first through fourth pixel circuits PC2-1 through PC2-4 may also vary. In this case, the first through fourth pixel circuits PC2-1 through PC2-4 may constitute a group, and the first through fourth pixel circuits PC2-1 through PC2-4 may constitute a round pixel circuit area PXA2. The round pixel circuit area PXA2 may have a half size of a round display element area U2. In an embodiment, a width X3 of the round pixel circuit area PXA2 in one direction may be half of a width X2 of the round display element area U2 in one direction, for example. A width Y3 of the round pixel circuit area PXA2 in another direction may be equal to a width Y2 of the round display element area U2 in another direction. In this case, in a plan view, an area of the round pixel circuit area PXA2 may be half of an area of the round display element area U2. The number of round pixel circuit areas PXA2 may be equal to the number of round display element areas U2 arranged in the round display area CDA. Although not shown in the drawings, middle display elements arranged in the middle display area MDA may be arranged in the round pixel circuit area PXA2. In this case, the middle display elements may have the same shape as that of the round display element area U2. The number of basic units arranged in the middle display area MDA may be the same as or similar to the number of round display element areas U2 in the round display area CDA.

FIG. 8B is a cross-sectional view of the third display element LE3, the fourth display element LE4, the seventh display element LE7, and the eighth display element LE8 taken along line D-D' of FIG. 8A. FIG. 8C is a cross-sectional view of the third display element LE3, the fourth display element LE4, the seventh display element LE7, and the eighth display element LE8 taken along line D-D' of FIG. 8A. FIG. 8D is a cross-sectional view of the third display element LE3, the fourth display element LE4, the seventh display element LE7, and the eighth display element LE8 taken along line D-D' of FIG. 8A.

Referring to FIG. 8B, the middle display area MDA may have a similar shape to the above-described middle display area. In this case, at least one driving circuit DC may be arranged in the middle display area MDA. In an embodiment, as shown in FIG. 8B, one driving circuit DC may be arranged below or around each pixel arranged in the middle display area MDA, for example. In another embodiment, a driving circuit DC may be arranged in the middle display area MDA and may be arranged between adjacent pixels.

As described above with reference to FIG. 8A, the third display element LE3, the fourth display element LE4, the seventh display element LE7, and the eighth display element LE8 may be connected to one second pixel circuit PC2-2. In this case, the third display element LE3, the fourth display element LE4, the seventh display element LE7, and the eighth display element LE8 may simultaneously emit light according to a signal.

Respective pixel electrodes 211 of the third display element LE3, the fourth display element LE4, the seventh display element LE7, and the eighth display element LE8 may be connected to the second conductive layer CL2-2. The second conductive layer CL2-2 may be arranged on the first insulating layer 115 and may extend to pass below the respective pixel electrodes 211 of the third display element LE3, the fourth display element LE4, the seventh display element LE7, and the eighth display element LE8. In this case, the second conductive layer CL2-2 may be unitary with a second connection conductive layer CL2-2*a*, and the second connection conductive layer CL2-2*a* may connect the second conductive layer CL2-2 to the second pixel circuit PC2-2.

Referring to FIG. 8C, the second connection conductive layer CL2-2*a* and the second conductive layer CL2-2 may be arranged in different layers. In an embodiment, the second connection conductive layer CL2-2*a* may be disposed on the first insulating layer 115, for example. In an alternative embodiment, the second conductive layer CL2-2 may be disposed on the second insulating layer 116. In this case, the second conductive layer CL2-2 may be unitary with the respective pixel electrodes 211 of the third display element LE3, the fourth display element LE4, the seventh display element LE7, and the eighth display element LE8 and may connect the respective pixel electrodes 211 of the third display element LE3, the fourth display element LE4, the seventh display element LE7, and the eighth display element LE8 to one another.

Referring to FIG. 8D, the second connection conductive layer CL2-2*a* and the second conductive layer CL2-2 may be arranged in different layers. In this case, a third insulating layer 117 may be arranged on the second insulating layer 116, and the pixel defining layer 118 may be arranged on the third insulating layer 117.

The first insulating layer 115 and the third insulating layer 117 may have the same material as or a similar material to the first insulating layer 115 of FIG. 6. In an embodiment, the second insulating layer 116 may include the same material as or a similar material to the first insulating layer 115. In another embodiment, the second insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. For convenience of description, a case where the first insulating layer 115, the second insulating layer 116, and the third insulating layer 117 include the same materials or similar materials will now be focused on and described in detail.

The respective pixel electrodes 211 of the third display element LE3, the fourth display element LE4, the seventh display element LE7, and the eighth display element LE8 may be arranged on the third insulating layer 117, one of the second conductive layer CL2-2 and the second connection conductive layer CL2-2a may be arranged on the second insulating layer 116, and the other may be arranged on the first insulating layer 115. The pixel electrodes 211, the second conductive layer CL2-2, and the second connection conductive layer CL2-2a may be connected to one another through a contact hole defined in each insulating layer. In this case, the second connection conductive layer CL2-2a may be connected to a second pixel circuit PC2-2.

Although not shown in the drawings, the fifth display element LE5, the sixth display element LE6, the thirteenth display element LE13, and the fourteenth display element LE14 of FIG. 8A may be connected to one another in the same manner as or a similar manner to that shown in FIGS. 8B through 8D. The eleventh display element LE11, the twelfth display element LE 12, the fifteenth display element LE15, and the sixteenth display element LE 16 of FIG. 8A may be connected to one another in the same manner as or a similar manner to that shown in FIGS. 8B through 8D. The first display element LE1, the second display element LE2, the ninth display element LE9, and the tenth display element LE10 of FIG. 8A may be connected to one another in the same manner as or a similar manner to that shown in FIGS. 8B through 8D.

Figure 8E:
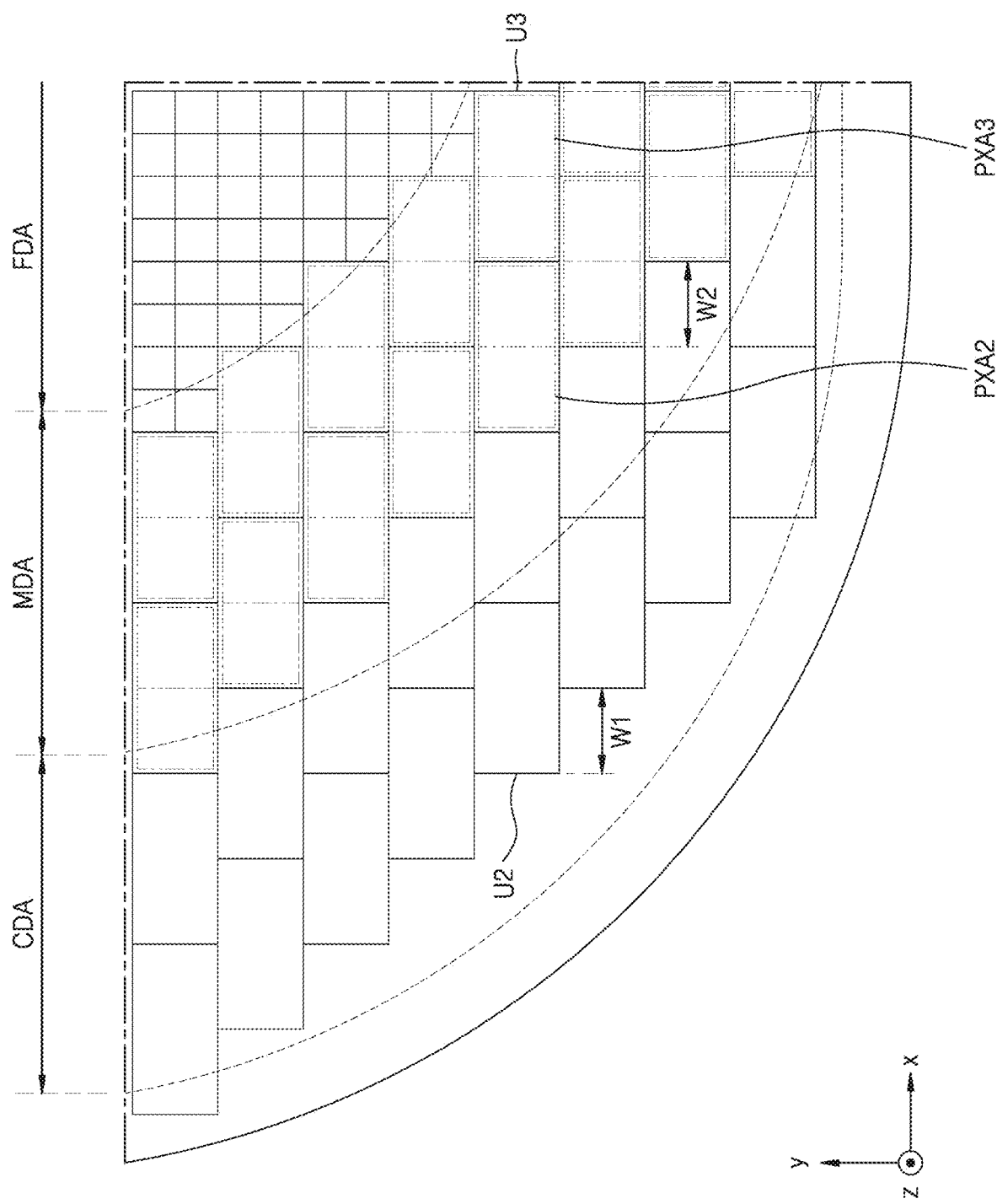
FIGS. 8E and 8F are plan views of an embodiment of a round display element area, a middle display element area, and a round pixel circuit area of a display panel according to the invention.

FIG. 8E is a plan view of an embodiment of a round display element area, a middle display element area, and a round pixel circuit area of a display panel according to the invention.

Referring to FIG. 8E, a plurality of round display element areas U2 may be arranged in the round display area CDA. One or more round display element areas U2 may be arranged in different layers along a round boundary of the round display area CDA. In this case, one of a plurality of round display element areas U2 arranged in one row may be arranged in a round portion of the round display area CDA. For convenience of description, a relationship between round display element areas U2 arranged in the round boundary of the round display area CDA will now be focused on and described in detail.

The round display element areas U2 arranged in different rows while being arranged in the boundary of the round display area CDA may be arranged in a stepped manner. In other words, one of the round display element areas U2 arranged in different rows may be arranged closer to the main display area FDA than another of the round display element areas U2 arranged in the different rows is to the main display area FDA. In an embodiment, one edge of one of the round display element areas U2 arranged in different rows may be moved rightwards with reference to FIG. 8E than one edge of another of the round display element areas U2 arranged in the different rows, for example. The distance between one edge of one of the round display element areas U2 and one edge of another of the round display element areas U2 arranged in different rows may be a first distance W1 between the one edge of the one of the round display element areas U2 arranged in different rows and the one edge of the other of the round display element areas U2 arranged in the different rows, the first distance W1 being measured in the first direction.

Middle display element areas U3 may be arranged in the middle display area MDA. Each of the middle display element areas U3 may have the same subpixel layout as that of the round display element area U2. In this case, a middle pixel circuit area PXA3 and/or a round pixel circuit area PXA2 may be arranged below the subpixels of each middle display element area U3. In an embodiment, only round pixel circuit areas PXA2 may be arranged in middle display element areas U3 arranged adjacent to the boundary between the middle display area MDA and the round display area CDA, for example. Middle pixel circuit areas PXA3 and round pixel circuit areas PXA2 may be arranged in middle display element areas U3 arranged in the middle of the middle display area MDA. Only middle pixel circuit areas PXA3 may be arranged in middle display element areas U3 arranged adjacent to the boundary between the middle display area MDA and the main display area FDA. As described above with reference to FIG. 8A, each round pixel circuit area PXA2 may include the first pixel circuit PC2-1, the second pixel circuit PC2-2, the third pixel circuit PC2-3, and the fourth pixel circuit PC2-4. Each middle pixel circuit area PXA3 may include middle pixel circuits arranged in the same layout as or a similar layout to that of the pixel circuits of each round pixel circuit area PXA2.

The middle pixel circuit areas PXA3 disposed on the boundary between the middle display area MDA and the round display area CDA in different rows may be arranged in a stepped manner. In an embodiment, the middle pixel circuit areas PXA3 may be arranged in different rows. In this case, respective one edges of the middle pixel circuit areas PXA3 arranged in different rows while being closer to the round display area CDA may be arranged apart from each other at regular intervals of a second distance W2, for example. The second distance W2 may be equal to a width of each middle pixel circuit area PXA3 in one direction (e.g., the width X3 of FIG. 8A). The second distance W2 may be half of the width of the round display element area U2 in one direction (e.g., the width X2 of FIG. 8A). The second distance W2 may be twice the first width X1 of each main unit area U1.

When the middle pixel circuit areas PXA3 disposed on the boundary between the middle display area MDA and the round display area CDA are spaced apart from each other at regular intervals and arranged in different rows as described above, the round display element areas U2 disposed on the boundary between the middle display area MDA and the round display area CDA in different rows may be spaced apart from each other at the same regular intervals as those for the middle pixel circuit areas PXA3. In other words, the first distance W1 and the second distance W2 may be the same as each other.

In this case, the round display element areas U2 disposed on the boundary between the middle display area MDA and the round display area CDA in different rows may be arranged apart from each other at regular intervals along the rounded boundary of the round display area CDA. In other words, the round display element areas U2 arranged in different rows may create a stepped shape by being spaced apart from each other at regular intervals. In this case, when the round display elements of the round display element area U2 emit light, a uniform pattern may be formed or provided on the round boundary of the round display area CDA and thus roughness in a round shape may be made uniform. Such an effect may be obtained not only on the boundary between the middle display area MDA and the round display area CDA but also on the boundary between the middle display area MDA and the main display area FDA and in the side display area SDA.

Therefore, the display panel may realize a uniform and soft image in the round area thereof.

Figure 8F:
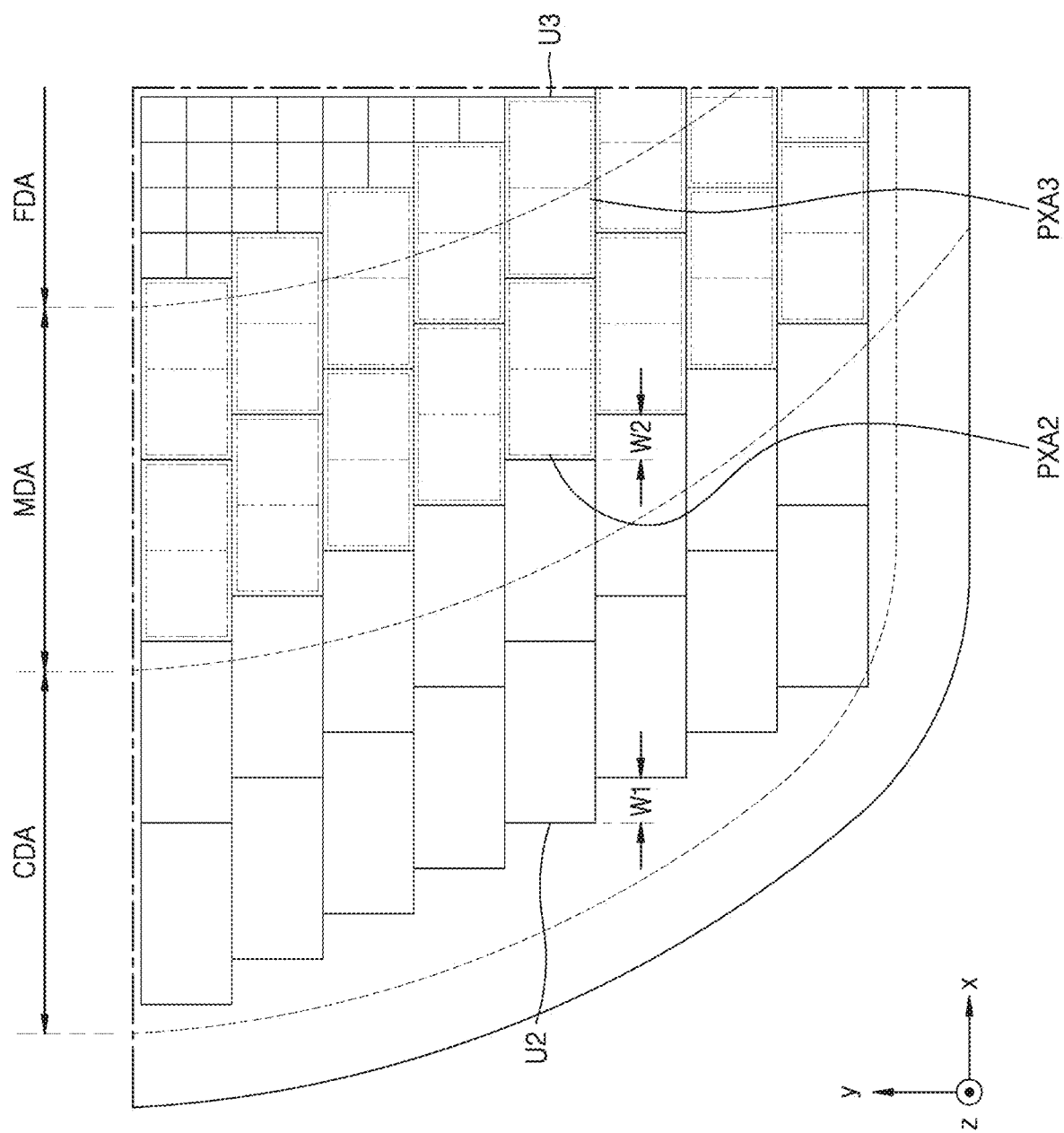

FIG. 8F is a plan view of an embodiment of a round display element area, a middle display element area, and a round pixel circuit area of a display panel according to the invention.

Referring to FIG. 8F, round display element areas U2 and round pixel circuit areas PXA2 may be the same as those shown in FIG. 8A. A first distance W1 between respective one edges of round display element areas U2 arranged adjacent to the round boundary of the round display area CDA in different rows may be equal to a second distance W2 between respective one edges of round pixel circuit area PXA2 arranged adjacent to the round boundary of the middle display area MDA in different rows.

Each of the first distance W1 and the second distance W2 may be half of a width of each round pixel circuit area PXA2 in one direction (e.g., the width X3 of FIG. 8A).

In this case, because the round display element areas U2 are sequentially arranged in a stepped manner on the round boundary of the round display area CDA and the first distance W1 is not substantially large, visible recognition of the boundary of the round display area CDA in a stepped manner may be reduced.

Figure 9A:
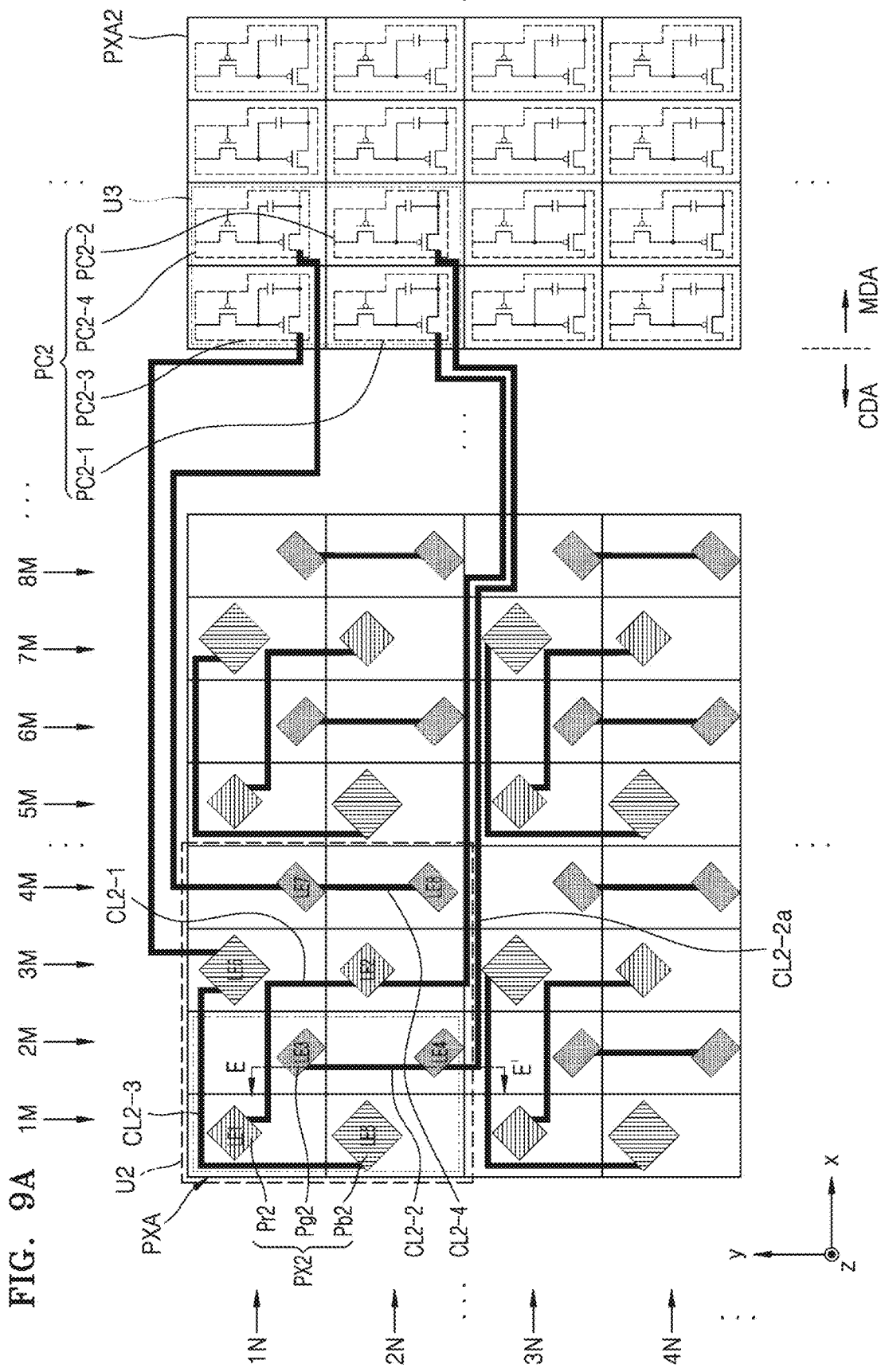
FIG. 9A is a plan view of another embodiment of arrangement and connection of pixels of a round display area of a display panel according to the invention.

FIG. 9A is a plan view of another embodiment of arrangement and connection of pixels of a round display area of a display panel according to the invention.

Referring to FIG. 9A, second pixels PX2 and third pixels (not shown) each including a plurality of subpixels may be arranged in each of the round display area CDA and the middle display area MDA. In this case, the round display area CDA and the middle display area MDA may have the same subpixel layouts or similar subpixel layouts. In this case, round pixel circuits PC2 may not be arranged in the round display area CDA, and round pixel circuits PC2 and middle pixel circuits (not shown) may be arranged in the middle display area MDA. For convenience of description, subpixels arranged in the round display area CDA and a round pixel circuit PC2 arranged in the middle display area MDA will now be described in detail. In this case, the round pixel circuit PC2 may include a first pixel circuit PC2-1, a second pixel circuit PC2-2, a third pixel circuit PC2-3, and a fourth pixel circuit PC2-4.

In an embodiment, a round display element area U2 may include a plurality of subpixels as shown in FIG. 8A. The round display element area U2 may correspond to half of the round display element area U2 of FIG. 8A. In particular, the round display element area U2 may have a width that is half of the width X2 of one edge of the round display area CDA of FIG. 8A and a width that is equal to the width Y2 of the other edge of the round display area CDA of FIG. 8A. The round display element area U2 may include two second red subpixels Pr2 (i.e., the first display element LE1 and the second display element LE2), four second green subpixels Pg2 (i.e., the third display element LE3, the fourth display element LE4, the seventh display element LE7, and the eighth display element LE8), and two second blue subpixels Pb2 (i.e., the fifth display element LE5 and the sixth display element LE6). The two second red subpixels Pr2 (i.e., the first display element LE1 and the second display element LE2), the four second green subpixels Pg2 (i.e., the third display element LE3 and the fourth display element LE4, the seventh display element LE7, and the eighth display element LE8), and the two second blue subpixels Pb2 (i.e., the fifth display element LE5 and the sixth display element LE6) may be arranged in the same manner as or a similar manner to that shown in FIG. 8A. Arrangement of subpixels arranged in the round display element area U2 and the number of subpixels are not limited to the above description, and may vary.

Round pixel circuit areas PXA2 may be arranged in the middle display area MDA. In each round pixel circuit areas PXA2, four pixel circuits, namely, the first, second, third, and fourth pixel circuits PC2-1, PC2-2, PC2-3, and PC2-4, may be arranged in two rows and two columns. In an embodiment, the first pixel circuit PC2-1 and the second pixel circuit PC2-2 may be arranged in the second row 2N, and the third pixel circuit PC2-3 and the fourth pixel circuit PC2-4 may be arranged in the first row 1N, for example. The first pixel circuit PC2-1 and the third pixel circuit PC2-3 may be arranged in the same column, and the second pixel circuit PC2-2 and the fourth pixel circuit PC2-4 may be arranged in the same column.

The first pixel circuit PC2-1 may be connected to the first display element LE1 and the second display element LE2, and the second pixel circuit PC2-2 may be connected to the third display element LE3 and the fourth display element LE4. The third pixel circuit PC2-3 may be connected to the fifth display element LE5 and the sixth display element LE6, and the fourth pixel circuit PC2-4 may be connected to the seventh display element LE7 and the eighth display element LE8. As described above with reference to FIG. 8A, a first conductive layer CL2-1, a second conductive layer CL2-2, a third conductive layer CL2-3, and a fourth conductive layer CL2-4 may connect display elements to pixel circuits. In this case, at least one of the first conductive layer CL2-1, the second conductive layer CL2-2, the third conductive layer CL2-3, and the fourth conductive layer CL2-4 may directly connect each display element to each pixel circuit or connect each display element to each pixel circuit through a connection conductive layer.

Figure 9B:
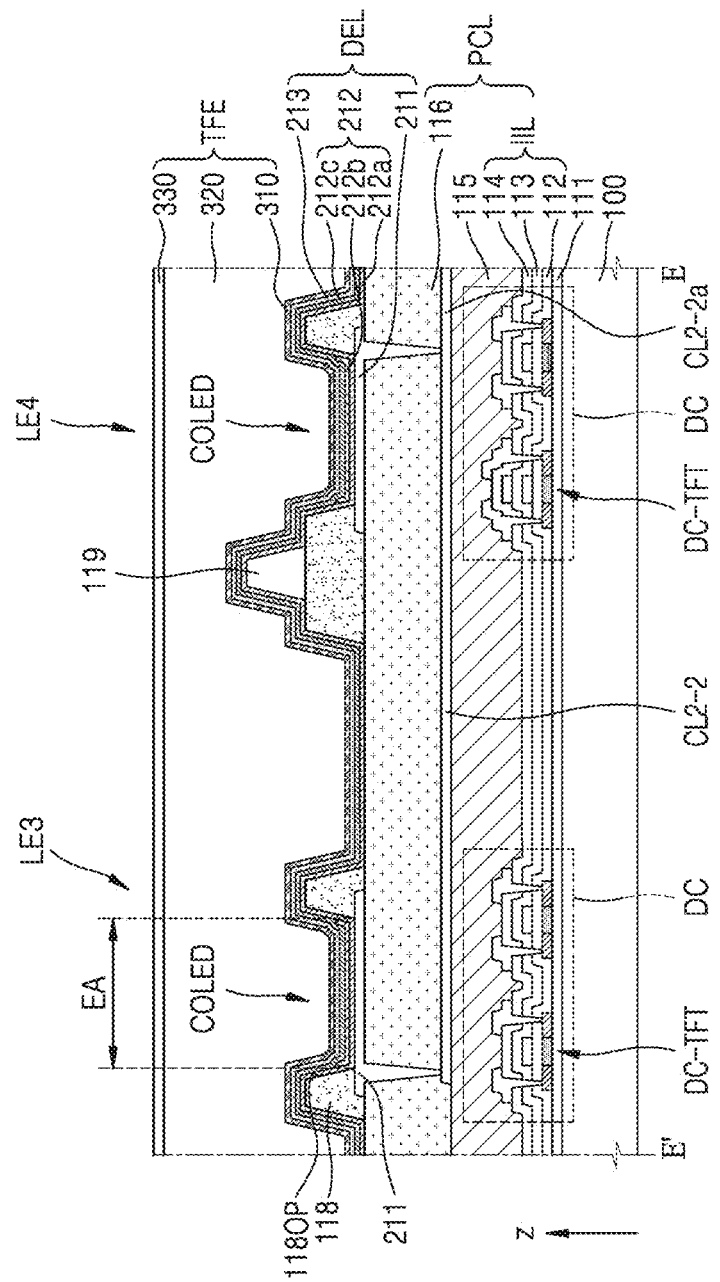
FIG. 9B is a cross-sectional view taken along line E-E' of FIG. 9A.

FIG. 9B is a cross-sectional view of the third display element LE3 and the forth display element LE4 taken along line E-E' of FIG. 9A.

Referring to FIG. 9B, two display elements arranged in a round display area (not shown) may be connected to one pixel circuit. In this case, each display element may be connected to one pixel circuit through one conductive layer or through one conductive layer and one connection conductive layer.

In an embodiment, the pixel electrode 211 of the third display element LE3 and the pixel electrode 211 of the fourth display element LE4 may be connected to the second conductive layer CL2-2 arranged on the first insulating layer 115, for example. The second conductive layer CL2-2 may be connected to the second connection conductive layer CL2-2a, and the second connection conductive layer CL2-2a may be connected to the second pixel circuit PC2-2.

Although not shown in the drawings, in another embodiment, the pixel electrode 211 of the third display element LE3 and the pixel electrode 211 of the fourth display element LE4 may be unitary with the second conductive layer CL2-2 and connected to the second connection conductive layer CL2-2a as shown in FIG. 8C. In another embodiment, the pixel electrode 211 of the third display element LE3 and the pixel electrode 211 of the fourth display element LE4 may be connected to the second conductive layer CL2-2 and the second connection conductive layer CL2-2a arranged on different insulating layers as shown in FIG. 8D.

Figure 9C:
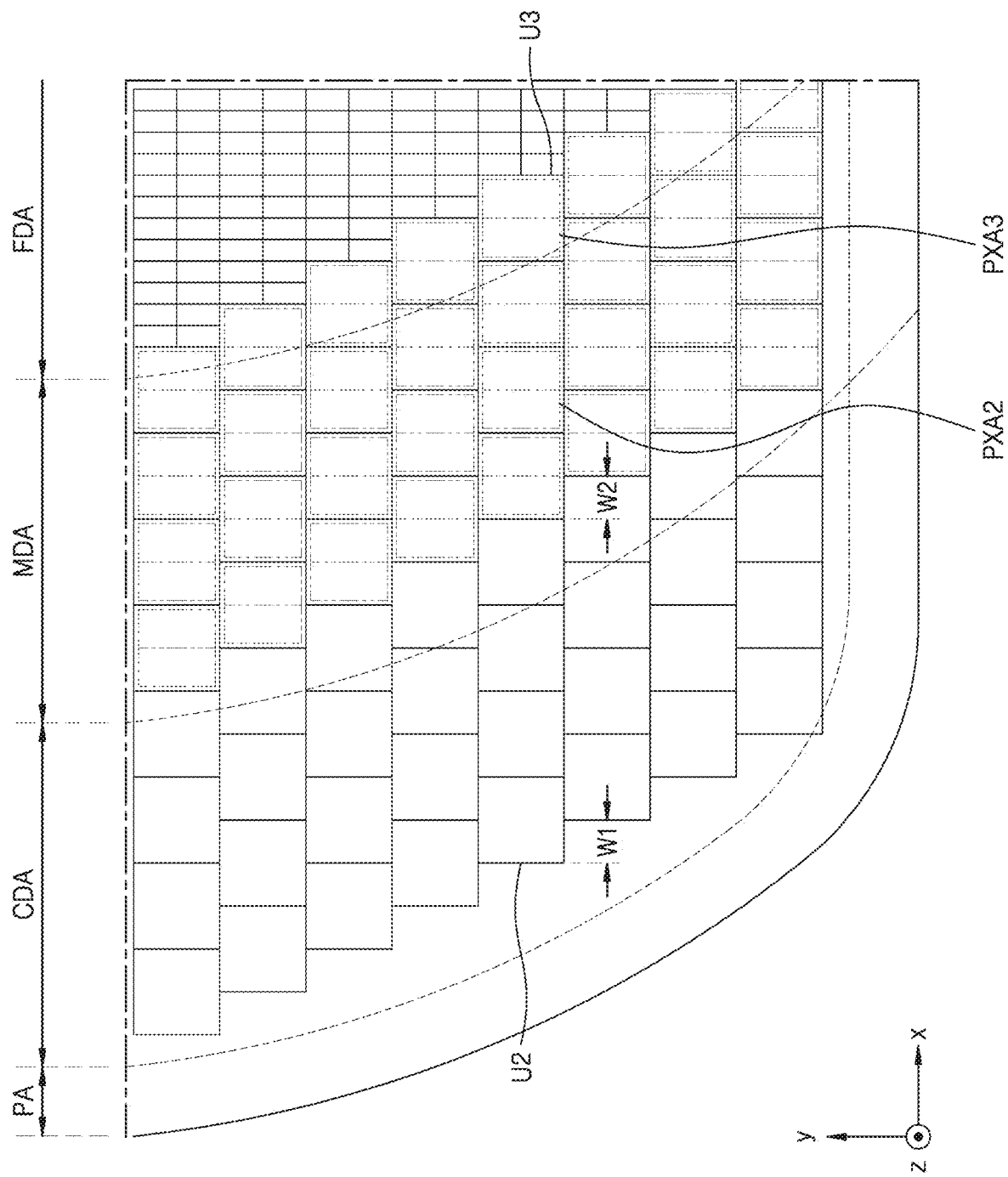
FIGS. 9C and 9D are plan views of another embodiment of a round display element area, a middle display element area, and a round pixel circuit area of a display panel according to the invention.

FIG. 9C is a plan view of another embodiment of a round display element area, a middle display element area, and a round pixel circuit area of a display panel according to the invention.

Referring to FIG. 9C, round display element areas U2 and round pixel circuit areas PXA2 may be the same as those shown in FIG. 9A. A first distance W1 between respective one edges of round display element areas U2 arranged adjacent to the round boundary of the round display area CDA in different rows may be equal to a second distance W2 between respective one edges of round pixel circuit area PXA2 arranged adjacent to the round boundary of the middle display area MDA in different rows.

Each of the first distance W1 and the second distance W2 may be the same as a width of each round pixel circuit area PXA2 in one direction (e.g., the width X3 of FIG. 8A).

In this case, because the round display element areas U2 are sequentially arranged in a stepped manner on the round boundary of the round display area CDA and the first distance W1 is not substantially large, visible recognition of the boundary of the round display area CDA in a stepped manner may be reduced.

When the round display element areas U2 are arranged in a stepped manner, the round display element areas U2 may be spaced apart from one another at regular intervals of the first distance W1 and thus may have uniform shapes.

Figure 9D:
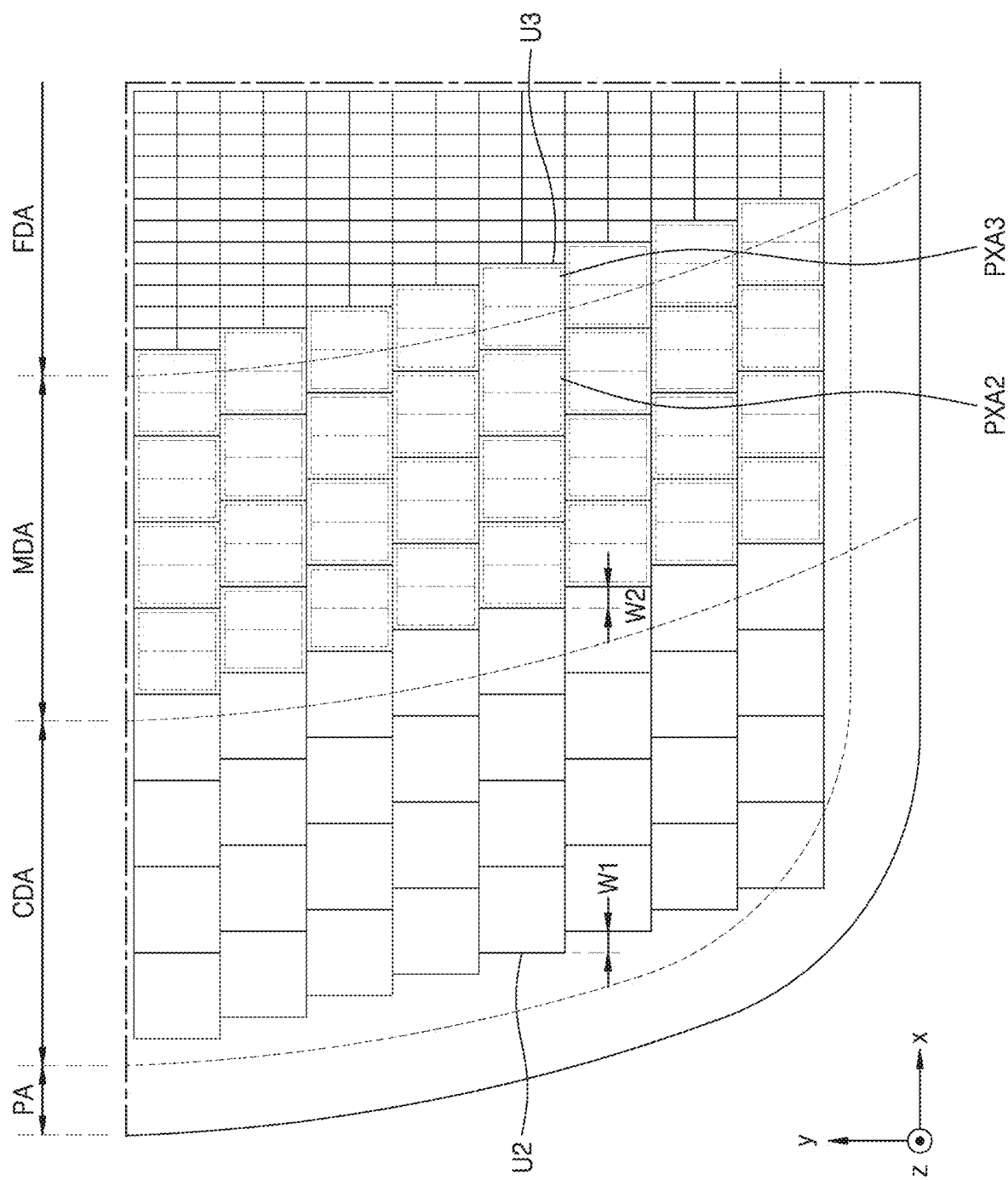

FIG. 9D is a plan view of another embodiment of a round display element area, a middle display element area, and a round pixel circuit area of a display panel according to the invention.

Referring to FIG. 9D, round display element areas U2 and round pixel circuit areas PXA2 may be the same as those shown in FIG. 9A. A first distance W1 between respective one edges of round display element areas U2 arranged adjacent to the round boundary of the round display area CDA in different rows may be equal to a second distance W2 between respective one edges of round pixel circuit area PXA2 arranged adjacent to the round boundary of the middle display area MDA in different rows.

Each of the first distance W1 and the second distance W2 may be half of a width of each round pixel circuit area PXA2 in one direction (e.g., the width X3 of FIG. 8A).

In this case, because the round display element areas U2 are sequentially arranged in a stepped manner on the round boundary of the round display area CDA and the first distance W1 is not substantially large, visible recognition of the boundary of the round display area CDA in a stepped manner may be reduced.

Figure 10:
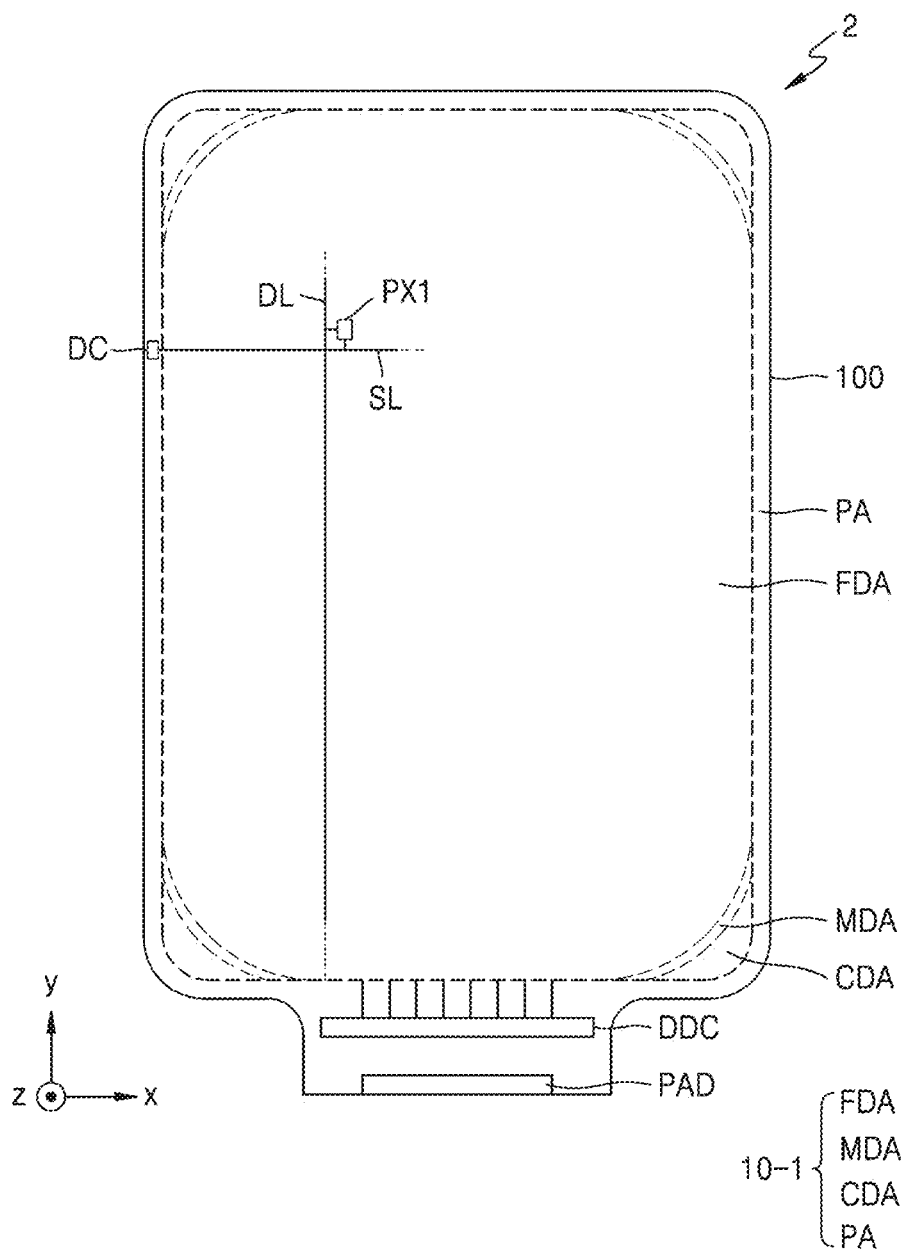
FIG. 10 is a cross-sectional view of another embodiment of a display panel according to the invention.

FIG. 10 is a cross-sectional view of another embodiment of a display panel according to the invention.

Referring to FIG. 10, a display device 2 may include a display panel 10-1. The display panel 10-1 may include a main display area FDA, a round display area CDA arranged in a round portion of a substrate 100, and a middle display area MDA arranged between the main display area FDA and the round display area CDA.

The display panel 10-1 may include the substrate 100, and a multi-layer arranged on the substrate 100. The main display area FDA, the round display area CDA, and the middle display area MDA may be defined in the substrate 100 and/or the multi-layer. In other words, the substrate 100 and/or the multi-layer may be understood as including the main display area FDA, the round display area CDA, and the middle display area MDA.

First pixels PX1 each including a main display element may be arranged in the main display area FDA. A driving circuit DC for providing an electrical signal or power wiring (not shown) for providing a voltage may be arranged in the middle display area MDA. Third pixels each including a middle display element may be arranged in the middle display area MDA. Second pixels each including a round display element may be arranged in the round display area CDA. In this case, an arrangement structure of each display element and each pixel circuit in the middle display area MDA and the round display area CDA may be one of the shapes shown in FIGS. 8A through 9C. Accordingly, a most part of the display panel 10-1 may display an image.

Figure 11:
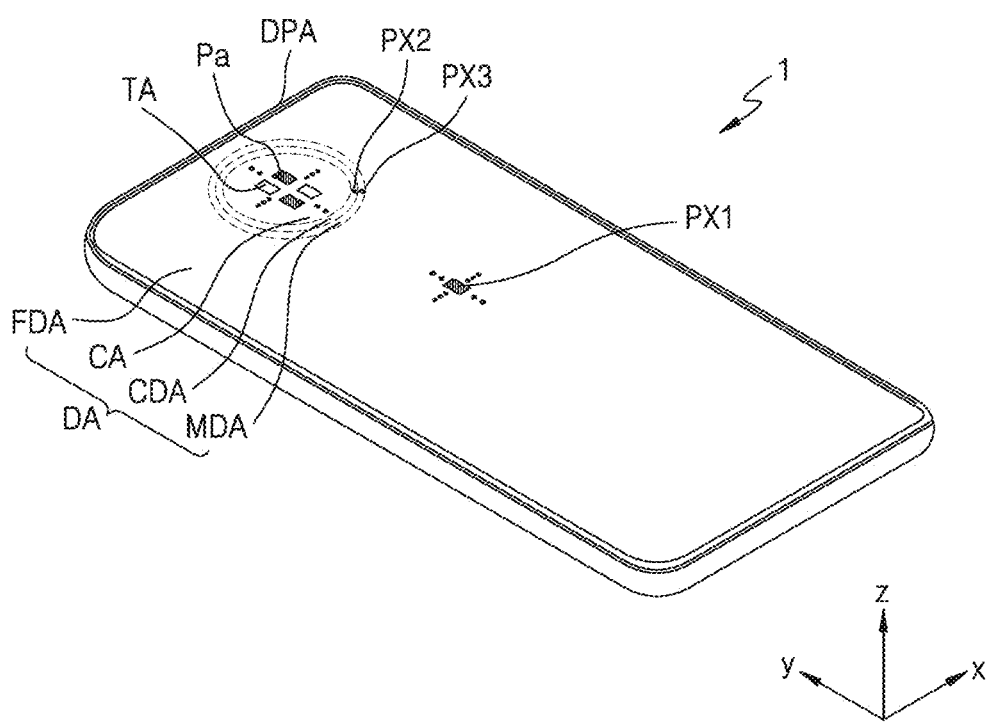
FIG. 11 is a perspective view of another embodiment of a display panel according to the invention.

FIG. 11 is a perspective view of another embodiment of a display panel according to the invention.

Referring to FIG. 11, a display device 1 includes a main display area FDA, and a peripheral area DPA outside the main display area FDA. The main display area FDA includes a component area CA, a round display area CDA at least partially surrounding the component area CA, and a middle display area MDA at least surrounding the round display area CDA. In other words, the component area CA and the main display area FDA may individually or together display an image. The peripheral area DPA may be a non-display area in which display elements are not arranged. The main display area FDA may be entirely surrounded by the peripheral area DPA.

FIG. 11 illustrates one component area CA disposed within the main display area FDA. In another embodiment, the display device 1 may have two or more component areas CA, and the component areas CA may have different shapes and different sizes. in a plan view, the component area CA may have any of various shapes such as a circular shape, an oval shape, a polygonal shape (e.g., a quadrangular shape (e.g., rectangular shape), a star shape, or a diamond shape. In FIG. 11, in a plan view, the component area CA is arranged at the center of an upper portion (in a +y direction) of the main display area FDA having an approximately quadrangular shape (e.g., rectangular shape), but the component area CA may be arranged on one side, for example, a right upper side or left upper side, of the main display area FDA.

The display device 1 may provide an image by a plurality of main subpixels Pm (refer to FIGS. 12A and 12B) arranged in the main display area FDA and a plurality of auxiliary subpixels Pa arranged in the component area CA.

In the component area CA, as will be described later with reference to FIGS. 12A and 12B, a component 40, which is an electronic element, may be arranged below a display panel to correspond to the component area CA. The component 40 is a camera using infrared light, visible light, or the like, and may include a photographing device. In an alternative embodiment, the component 40 may be a solar battery, a flash, an illuminance sensor, a proximity sensor, or an iris sensor. In an alternative embodiment, the component 40 may have a function of receiving sound. In order to minimize restrictions on the function of the component 40, the component area CA may include a transmission area TA capable of transmitting light or/and sound that is output from the component 40 to the outside or travels from the outside toward the component 40. In a display panel and a display device including the same, in an embodiment of the invention, when light is transmitted through the component area CA, a light transmittance in the component area CA may be about 10% or greater, for example, 40% or greater, 25% or greater, 50% or greater, 85% or greater, or 90% or greater.

A plurality of auxiliary subpixels Pa may be arranged in the component area CA. Each of the plurality of auxiliary subpixels Pa may emit light to provide a predetermined image. An image displayed by the component area CA is an auxiliary image and thus may have lower resolution than an image displayed by the main display area FDA. In other words, when the component area CA includes the transmission area TA capable of transmitting light and sound and subpixels are not arranged in the transmission area TA, the number of auxiliary subpixels Pa that may be arranged on a unit area in the component area CA may be less than the number of main subpixels Pm arranged on a unit area in the main display area FDA.

The middle display area MDA and the round display area CDA may prevent the boundary of the component area CA from being visible in the form of an irregularity due to an arrangement of the subpixels on the boundary of the component area CA.

In this case, the middle display area MDA and the round display area CDA may be the same as or similar to the types shown in FIGS. 8A through 9C.

Therefore, the boundary of the component area CA of the display device 1 is smoothly visible, and thus a sense of beauty of the boundary of the component area CA may improve and distortion of an image in a boundary portion of the component area CA may be reduced.

Figure 12A:
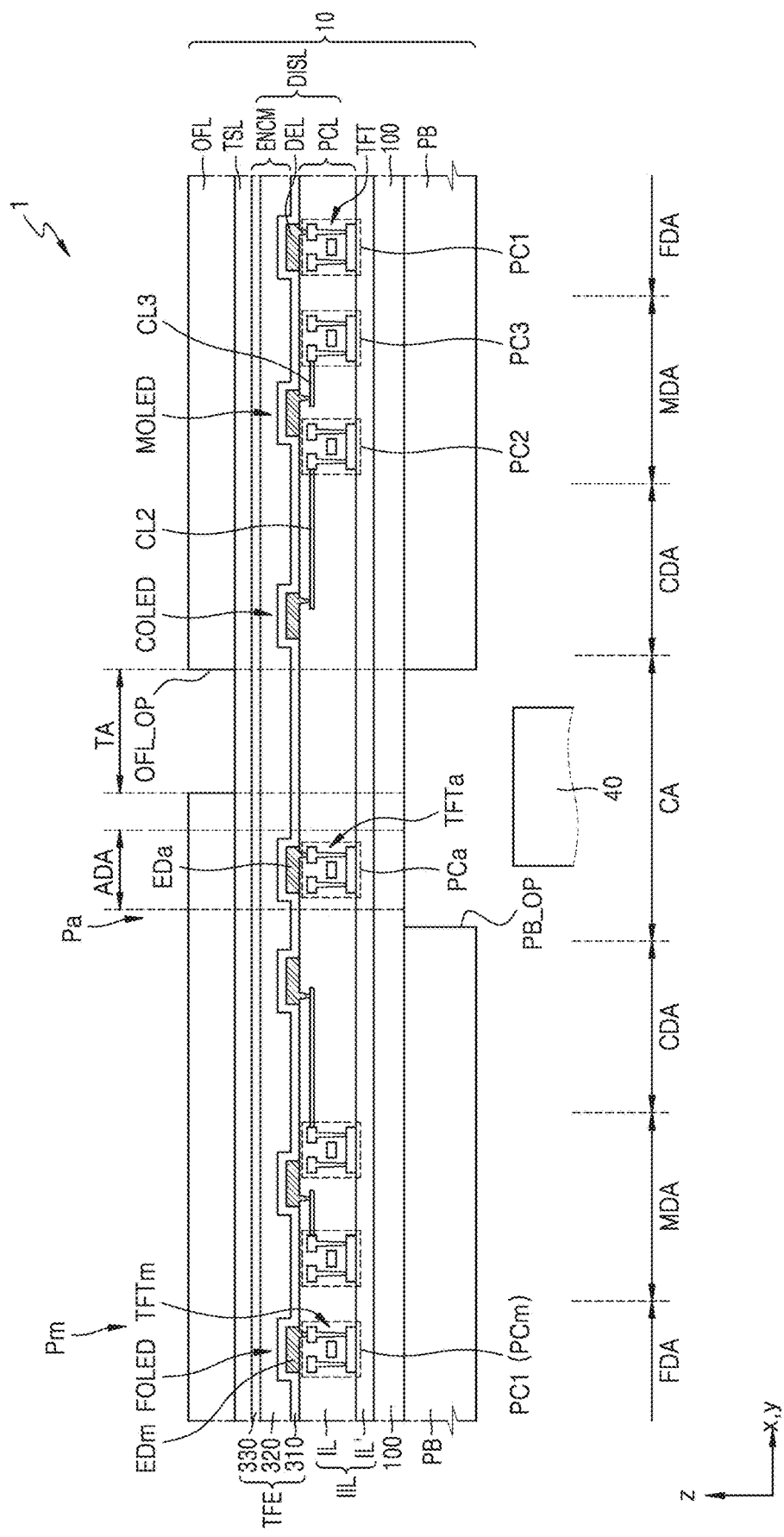
FIGS. 12A and 12B are cross-sectional views of another embodiment of a display panel according to the invention.

FIG. 12A is a cross-sectional view of another embodiment of a display panel according to the invention. FIG. 12B is a cross-sectional view of another embodiment of a display panel according to the invention.

Figure 12B:
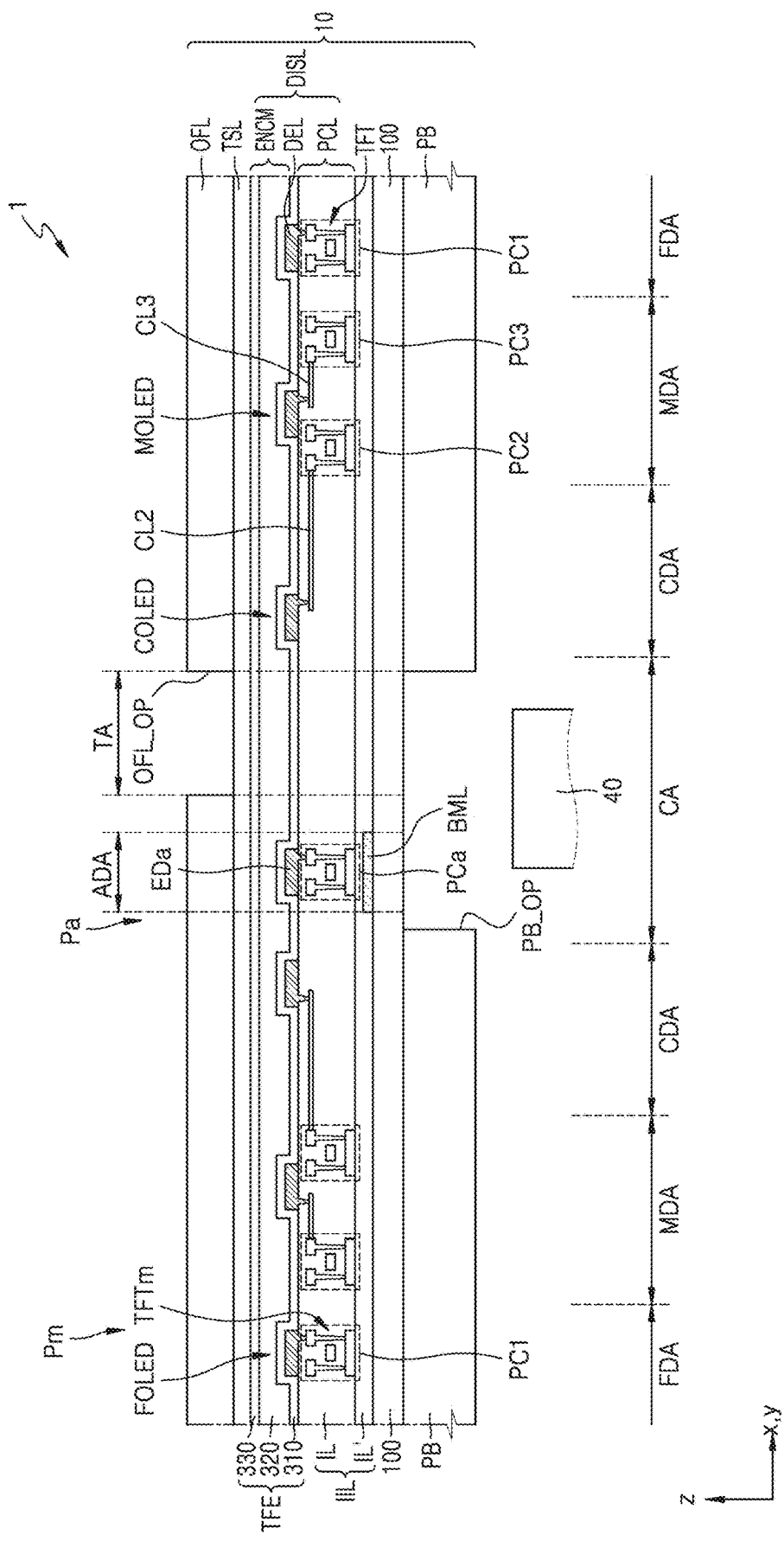

Referring to FIGS. 12A and 12B, the display devices 1 may include a display panel 10 and a component 40 overlapped by the display panel 10. A cover window (not shown) may be further over the display panel 10 to protect the display panel 10.

The display panel 10 may include a component area CA that overlaps the component 40, a round display area CDA surrounding the component area CA, a middle display area MDA surrounding the round display area CDA, and a main display area FDA surrounding at least a portion of the middle display area MDA and displaying a main image. The display panel 10 may include a substrate 100, a display layer DISL, a touch screen layer TSL, and an optical functional layer OFL on the substrate 100, and a panel protection member PB below the substrate 100.

The display layer DISL may include a pixel circuit layer PCL including thin-film transistors TFT, TFTm and TFTa, a display element layer DEL including light-emitting diodes (FOLED, MOLED, COLED, and EDa) that are display elements, and an encapsulation member ENCM such as a thin-film encapsulation layer TFE or an encapsulation substrate (not shown). Insulating layers IL and IL' may be arranged between the substrate 100 and the display layer DISL and within the display layer DISL. A case where the light-emitting diodes are organic light-emitting diodes will now be focused on and described in detail.

The substrate 100 may include an insulative material, such as glass, quartz, and polymer resin. The substrate 100 may be a rigid substrate or a flexible substrate that is bendable, foldable, or rollable.

A main pixel circuit PC1 (also referred to as a main pixel circuit PCm) and a main light-emitting diode EDm connected thereto may be arranged in the main display area FDA of the display panel 10. The main pixel circuit PC1 may include at least one thin-film transistor TFTm and may control light emission of the main light-emitting diode EDm. A main subpixel Pm may be implemented due to light emission of the main light-emitting diode EDm.

An auxiliary light-emitting diode EDa may be arranged in the component area CA of the display panel 10 to implement an auxiliary subpixel Pa. An auxiliary pixel circuit PCa may be disposed in the component area CA to drive the auxiliary light-emitting diode EDa.

The auxiliary pixel circuit PCa may include at least one thin-film transistor TFTa and may be electrically connected to the auxiliary light-emitting diode EDa. The auxiliary subpixel Pa may be implemented due to light emission of the auxiliary light-emitting diode EDa. An area where the auxiliary light-emitting diode EDa is arranged, in the component area CA, may refer to as an auxiliary display area ADA.

An area where the auxiliary light-emitting diode EDa, which is a display element, is not arranged, in the component area CA, may refer to as a transmission area TA. The transmission area TA may transmit a light/signal emitted by the component 40 arranged to correspond to the component area CA or a light/signal incident upon the component 40. The auxiliary display area ADA and the transmission area TA may be arranged alternately with each other in the component area CA.

A middle organic light-emitting diode MOLED, which is a middle display element, may be arranged in the middle display area MDA. A round organic light-emitting diode COLED, which is a round display element, may be arranged in the round display area CDA. The middle organic light-emitting diode MOLED may be connected to a middle pixel circuit PC3 arranged in the middle display area MDA or the main display area FDA through a third connection line CL3. For convenience of description, a case where the middle pixel circuit PC3 is arranged in the middle display area MDA will now be focused on and described in detail. The round organic light-emitting diode COLED may be connected to a round pixel circuit PC2 through a second connection line CL2. The round pixel circuit PC2 may be arranged under the middle organic light-emitting diode MOLED.

The display element layer DEL may be covered by the thin-film encapsulation layer TFE or by the encapsulation substrate. According to some embodiments, the thin-film encapsulation layer TFE may include at least one inorganic encapsulation layer and at least one organic encapsulation layer, as shown in FIGS. 12A and 12B. In an embodiment, the thin-film encapsulation layer TFE may include first and second inorganic encapsulation layers 310 and 330 and an organic encapsulation layer 320 therebetween.

The first inorganic encapsulation layer 310 and the second inorganic encapsulation layer 330 may include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed or provided by chemical vapor deposition ("CVD"). The organic encapsulation layer 320 may include a polymer-based material. Examples of the polymer-based material may include a silicon-based resin, an acryl-based resin, an epoxy-based resin, polyimide ("PI"), and polyethylene.

The first inorganic encapsulation layer 310, the organic encapsulation layer 320, and the second inorganic encapsulation layer 330 may each be integrally provided to cover the main display area FDA and the component area CA.

When the display element layer DEL is sealed by the encapsulation substrate, the encapsulation substrate may be arranged to face the substrate 100 with the display element layer DEL therebetween. A gap may exist between the encapsulation substrate and the display element layer DEL. The encapsulation substrate may include glass. A sealant including frit or the like may be arranged between the substrate 100 and the encapsulation substrate, and may be arranged in the peripheral area DPA. The sealant arranged in the peripheral area DPA may surround the display area DA and prevent moisture from permeating through the side surfaces of the display panel 10.

The touch screen layer TSL may obtain coordinate information based on an external input, for example, a touch event. The touch screen layer TSL may include a touch electrode and touch wires connected to the touch electrode. The touch screen layer TSL may sense an external input according to a self-capacitance method or a mutual capacitance method.

The touch screen layer TSL may be disposed on the thin-film encapsulation layer TFE. In an alternative embodiment, the touch screen layer TSL may be separately provided on a touch substrate and then coupled to the upper surface of the thin-film encapsulation layer TFE via an adhesive layer, such as an OCA. In an embodiment, the touch screen layer TSL may be provided directly on the thin-film encapsulation layer TFE. In this case, adhesive layers may not be disposed between the touch screen layer TSL and the thin-film encapsulation layer TFE.

The optical functional layer OFL may include an anti-reflection layer. The anti-reflection layer may reduce reflectivity of light (external light) that is incident from an external source toward the display device 1.

According to some embodiments, the optical functional layer OFL may be a polarization film. An opening OFL_OP corresponding to the transmission area TA may be defined in the optical functional layer OFL. Accordingly, the light transmittance of the transmission area TA may significantly improve. The opening OFL_OP may be filled with a transparent material such as an optically clear resin ("OCR").

According to some embodiments, the optical functional layer OFL may be implemented using a filter plate including a black matrix and color filters.

The panel protection member PB may be attached to a lower surface of the substrate 100 and may support and protect the substrate 100. An opening PB_OP corresponding to the component area CA may be defined in the panel protection member PB. The inclusion of the opening PB_OP in the panel protection member PB may improve the light transmittance of the component area CA. The panel protection member PB may include PET or PI.

The component area CA may have a larger area than an area where the component 40 is arranged. Accordingly, the area of the opening PB_OP included in the panel protection member PB may not be identical with the area of the component area CA.

A plurality of components 40 may be arranged in the component area CA. The plurality of components 40 may perform different functions. In an embodiment, the plurality of components 40 may include at least two of a camera (photographing device), a solar cell, a flash, a proximity sensor, an illuminance sensor, and an iris sensor, for example.

FIG. 12A does not illustrate a bottom metal layer BML arranged under the auxiliary light-emitting diode EDa of the component area CA. However, as shown in FIG. 12B, the display device 1 in an embodiment may include the bottom metal layer BML.

The bottom metal layer BML may be arranged between the substrate 100 and the auxiliary light-emitting diode EDa such as to be overlapped by the auxiliary light-emitting diode EDa. The bottom metal layer BML may prevent external light from reaching the auxiliary light-emitting diode EDa. According to some embodiments, the bottom metal layer BML may be arranged to correspond to the entire component area CA, and a bottom-hole corresponding to the transmission area TA may be defined in the bottom metal layer BML. In this case, the bottom-hole may be provided in any of various shapes such as a polygon, a circle, or an irregular shape, and may adjust the diffraction characteristics of external light.

Figure 12C:
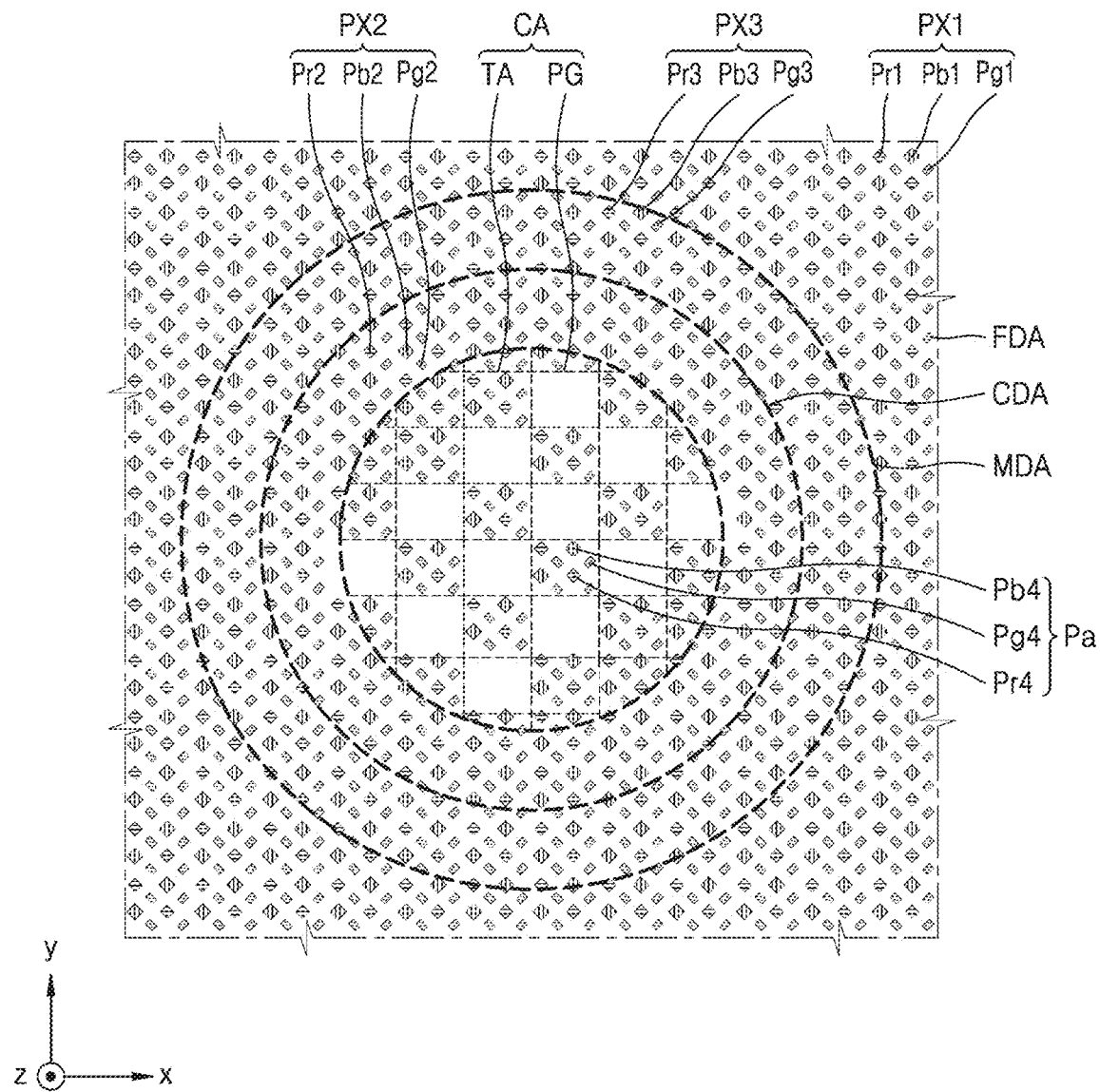
FIG. 12C is a plan view illustrating pixel arrangements of a component area, a round display area, a middle display area, and a portion of a main display area of FIG. 11.

FIG. 12C is a plan view illustrating pixel arrangements of the component area CA, the round display area CDA, the middle display area MDA, and a portion of the main display area FDA of FIG. 11.

Referring to FIG. 12C, the component areas CA may be included in the round display area CDA. The middle display area MDA may be disposed in the main display area FDA, and the round display area CDA may be disposed in the middle display area MDA.

Pixel groups may be arranged in the component area CA, the round display area CDA, the middle display area MDA, and the main display area FDA. A plurality of pixels with a same number and a same arrangement may be arranged in each of the round display area CDA, the middle display area MDA, and the main display area FDA. In this case, pixels may be uniformly arranged in the round display area CDA, the middle display area MDA, and the main display area FDA.

The main display area FDA may include a plurality of first pixels PX1 spaced apart from one another, and each of the plurality of first pixels PX1 may include a first red subpixel Pr1, a first green subpixel Pg1, and a first blue subpixel Pb1. The middle display area MDA may include a plurality of third pixels PX3 spaced apart from one another, and each of the plurality of third pixels PX3 may include a third red subpixel Pr3, a third green subpixel Pg3, and a third blue subpixel Pb3. The round display area CDA may include a plurality of second pixels PX2 spaced apart from one another, and each of the plurality of second pixels PX2 may include a second red subpixel Pr2, a second green subpixel Pg2, and a second blue subpixel Pb2. In this case, each of the first pixel PX1, the second pixel PX2, and the third pixel PX3 may include subpixels with a same number and a same arrangement.

In this case, as shown in FIGS. 12A and 12B, pixel circuits respectively corresponding to the subpixels may be arranged in the main display area FDA. A middle pixel circuit and a round pixel circuit respectively connected to each subpixel of the second pixel PX2 and each subpixel of the third pixel PX3 may be arranged in the middle display area MDA. However, pixel circuits may not be arranged in the round display area CDA. In this case, the subpixels of the second pixel PX2 may be connected to the pixel circuits arranged in the middle display area MDA.

The component area CA may have a pixel group PG and a transmission area TA. The pixel group PG may include a fourth red subpixel Pr4, a fourth green subpixel Pg4, and a fourth blue subpixel Pb4.

In this case, the plurality of subpixels arranged in each area is not limited to the above-described subpixels. In an embodiment, the plurality of subpixels may include subpixels that emit yellow light, red light, and blue light, respectively, for example. In another embodiment, the plurality of subpixels may include subpixels that emit white, red light, blue light, and yellow light, respectively.

FIGS. 13A through 13G are plan views illustrating a pixel layout of the component area CA of FIG. 11.

Referring to FIGS. 13A through 13G, a plurality of auxiliary subpixels Pa may be arranged in any of various configurations within the component area CA.

Figure 13A:
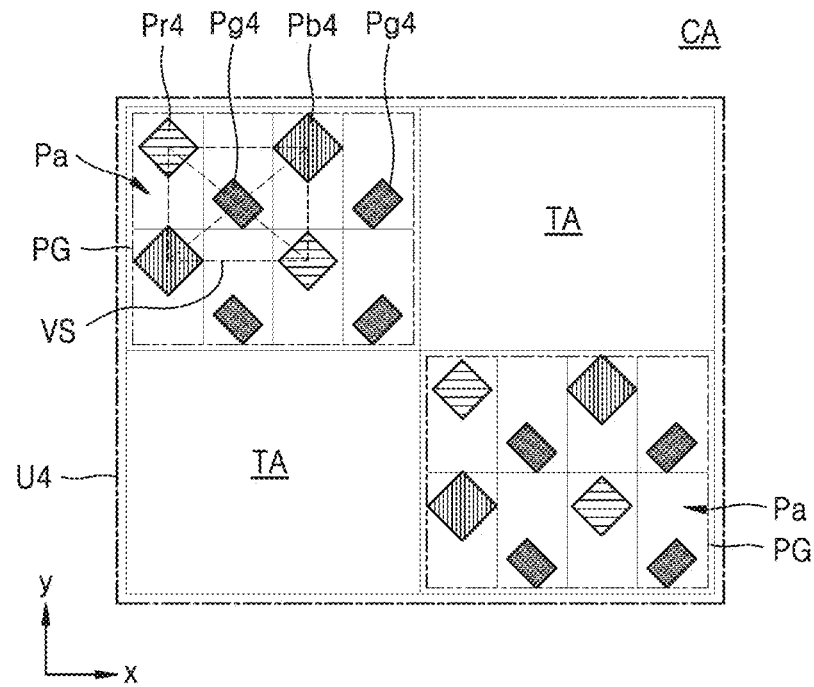
FIGS. 13A through 13G are plan views illustrating a pixel layout of the component area of FIG. 11.

Referring to FIG. 13A, a plurality of auxiliary subpixels Pa may be arranged in the component area CA. Each of the auxiliary subpixels Pa may emit, for example, red light, green light, blue light, or white light.

The component area CA may include a pixel group PG and a transmission area TA, the pixel group PG including at least one auxiliary subpixel Pa. The pixel group PG and the transmission area TA may be arranged alternately with each other both in the x direction and the y direction, and may be arranged in, for example, a lattice configuration. In this case, the component area CA may have a plurality of pixel groups PG and a plurality of transmission areas TA.

The pixel group PG may be defined as a subpixel set in which a plurality of auxiliary subpixels Pa is grouped in a predetermined unit. In an embodiment, as shown in FIG. 13A, a single pixel group PG may include eight auxiliary subpixels Pa arranged in a Pentile structure, for example. In other words, a single pixel group PG may include two fourth red subpixels Pr4, four fourth green subpixels Pg4, and two fourth blue subpixels Pb4.

In the component area CA, a component basic unit U4 including a predetermined number of pixel groups PG and a predetermined number of transmission areas TA may be repeated in the x direction and the y direction. In FIG. 13A, the component basic unit U4 may have a quadrilateral shape in which two pixel groups PG and two transmission areas TA arranged around the pixel groups PG are grouped. The component basic unit U4 is a repetitive structure and does not indicate a disconnected configuration.

In the main display area FDA, a corresponding unit having the same area as that of the component basic unit U4 may be set. In this case, the number of main subpixels Pm included in the corresponding unit may be greater than that of auxiliary subpixels Pa included in the component basic unit U4. In other words, the number of auxiliary subpixels Pa included in the component basic unit U4 is 16 and the number of main subpixels Pm included in the corresponding unit is 32, and thus the number of auxiliary subpixels Pa and the number of main subpixels Pm arranged in the same area may be 1:2.

A pixel arrangement structure of the component area CA in which the auxiliary subpixels Pa are arranged in a Pentile structure as shown in FIG. 13A and a resolution of the component area CA is ½ of the resolution of the main display area FDA is also referred to as a ½ Pentile structure. The number of auxiliary subpixels Pa included in the pixel group PG or an arrangement method thereof may be modified according to the resolution of the component area CA.

Figure 13B:
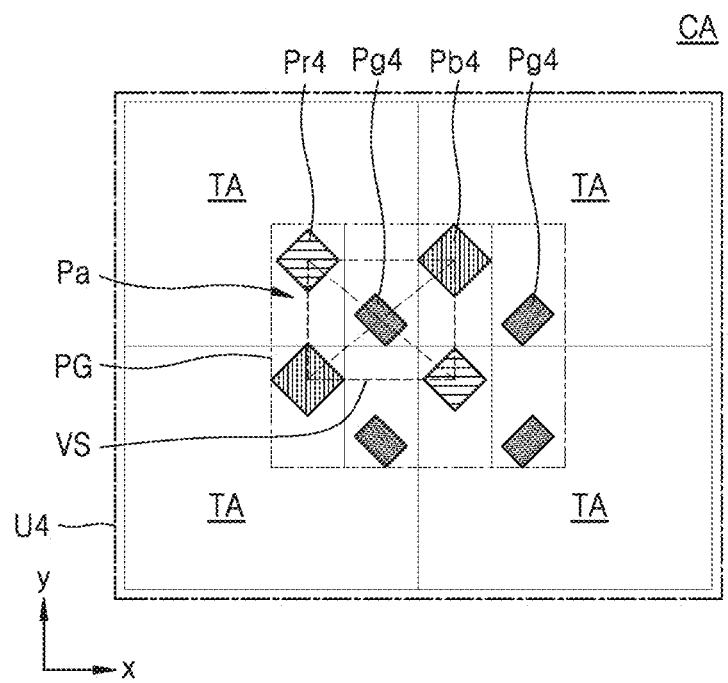

Referring to FIG. 13B, the pixel arrangement structure of the component area CA may be a ¼ Pentile structure. In the illustrated embodiment, the pixel group PG includes eight auxiliary subpixels Pa arranged in a Pentile structure, but the component basic unit U4 may include only one pixel group PG. The remaining area of the component basic unit U4 not occupied by the one pixel group PG may be filled with transmission areas TA. Accordingly, the number of auxiliary subpixels Pa and the number of main subpixels Pm arranged in the same area may be 1:4. In this case, the one pixel group PG may be surrounded by the transmission areas TA.

Figure 13C:
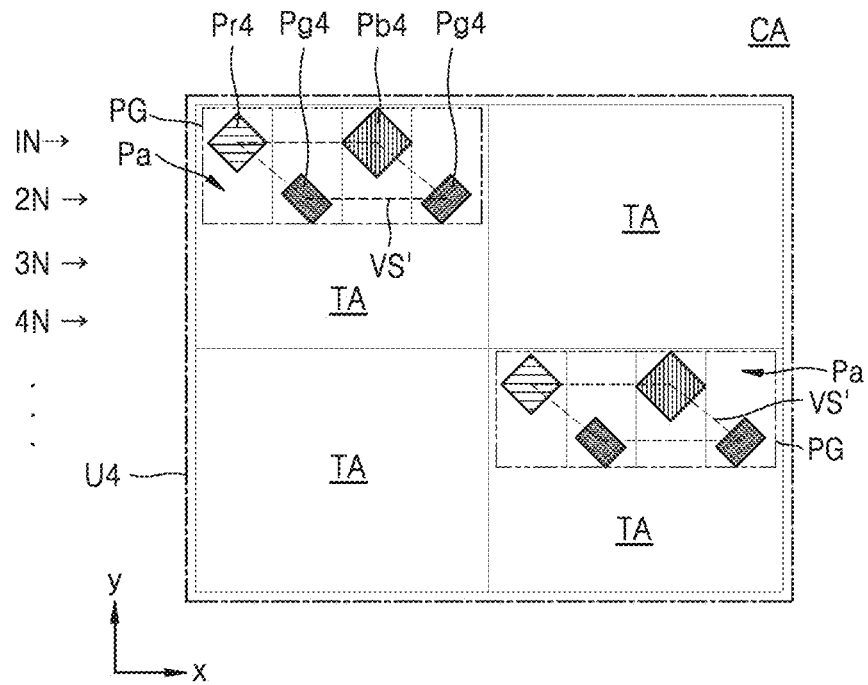

Referring to FIG. 13C, the pixel arrangement structure of the component area CA may be a ¼ Pentile distributed structure. In the illustrated embodiment, two pixel groups PG may be distributed and arranged in the component basic unit U4. A single pixel group PG may be based on a Pentile structure and may include a total of four auxiliary subpixels Pa, namely, one fourth red subpixel Pr4, two fourth green subpixels Pg4, and one fourth blue subpixel Pb4.

The four auxiliary subpixels Pa may be arranged at the four vertexes of a virtual quadrilateral VS', respectively. In an embodiment, the virtual quadrilateral VS' may be a parallelogram. The fourth red subpixel Pr4 and the fourth blue subpixel Pb4 may be arranged in the first row 1N, and the two fourth green subpixels Pg4 may be arranged in the second row 2N.

Because a pixel group PG and a transmission area TA are arranged alternately, as the number of auxiliary subpixels Pa included in each pixel group PG decreases, the auxiliary subpixels Pa may be more distributed within the component basic unit U4.

Figure 13D:
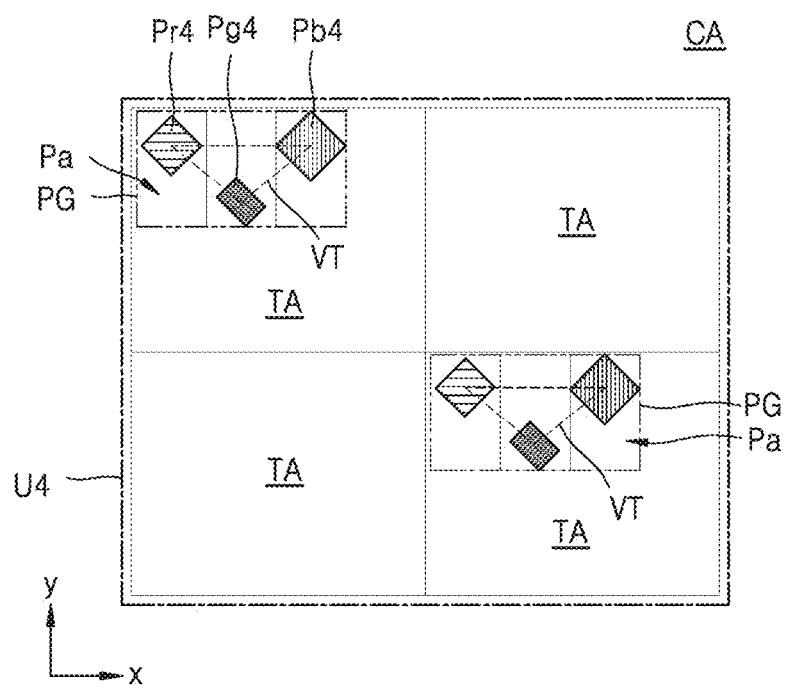

Referring to FIG. 13D, the pixel arrangement structure of the component area CA may be a 3/8 Pentile structure. In the illustrated embodiment, four pixel groups PG may be distributed and arranged in the component basic unit U4. A single pixel group PG may be based on a Pentile structure and may include a total of three auxiliary subpixels Pa, namely, one fourth red subpixel Pr4, one fourth green subpixel Pg4, and one fourth blue subpixel Pb4. In the arrangement of the auxiliary subpixels Pa in the single pixel group PG, the fourth red subpixel Pr, the fourth green subpixel Pg, and the fourth blue subpixel Pb may be arranged at the three vertexes of a virtual triangle VT, respectively.

When compared with the basic Pentile structure in the main display area FDA of FIGS. 12A through 12C, the pixel arrangement structure in the illustrated embodiment does not include subpixels in the third row 3N and the fourth row 4N and also does not include subpixels in a fourth column 4M. Accordingly, the number of auxiliary subpixels Pa included in the component basic unit U4 is 12 and the number of main subpixels Pm included in the corresponding unit is 32, and thus the number of auxiliary subpixels Pa and the number of main subpixels Pm arranged in the same area may be 3:8.

Figure 13E:
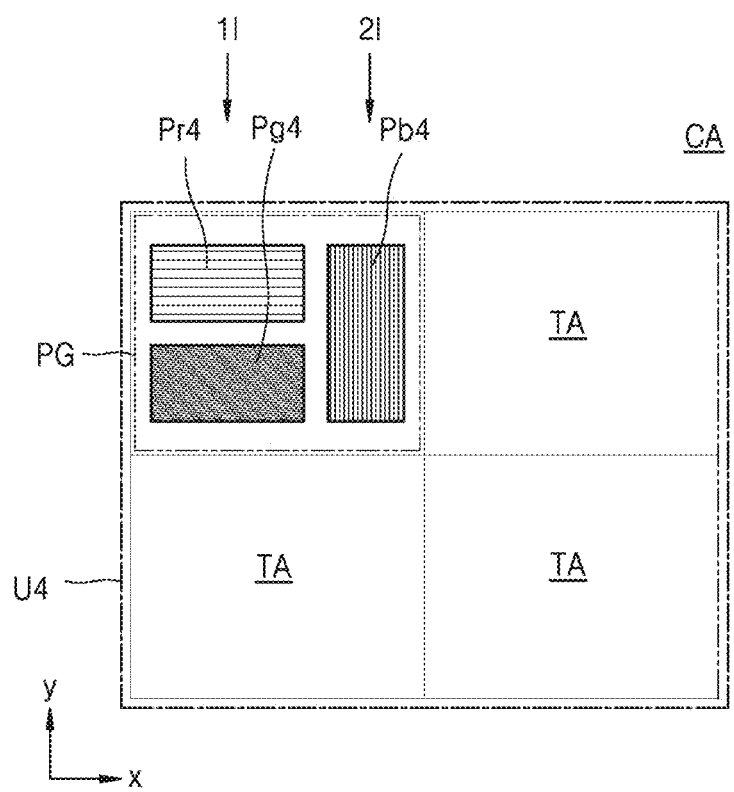

Referring to FIG. 13E, the pixel arrangement structure of the component area CA may be an S-stripe structure. In the illustrated embodiment, a single pixel group PG may include a total of three auxiliary subpixels Pa, namely, one fourth red subpixel Pr4, one fourth green subpixel Pg4, and one fourth blue subpixel Pb4.

In the illustrated embodiment, one fourth red subpixel Pr4 and one fourth green subpixel Pg4 may alternate with each other in a first column 11, and one fourth blue subpixel Pb4 may be arranged in a second column 21 adjacent to the first column 11. In this case, each of the fourth red subpixel Pr4 and the fourth green subpixel Pg4 has a quadrangular shape (e.g., rectangular shape) having a longer side in the x direction, and the fourth blue subpixel Pb4 may be arranged to have a quadrangular shape (e.g., rectangular shape) having a longer side in the y direction. A length of the fourth blue subpixel Pb4 in the y direction may be equal to or greater than a sum of a length of the fourth red subpixel Pr4 in the y direction and a length of the fourth green subpixel Pg4 in the y direction. Accordingly, a size of the fourth blue subpixel Pb4 may be greater than a size of each of the fourth red and green subpixels Pr4 and Pg4.

In the illustrated embodiment, an area of the component basic unit U4 occupied by the single pixel group PG may be about ¼ of the component basic unit U4. In FIG. 13E, only one pixel group PG is included in the component basic unit U4. However, in another embodiment, the component basic unit U4 may include two or more pixel groups PG. The area of the auxiliary subpixels Pa included in each pixel group PG may vary.

Figure 13F:
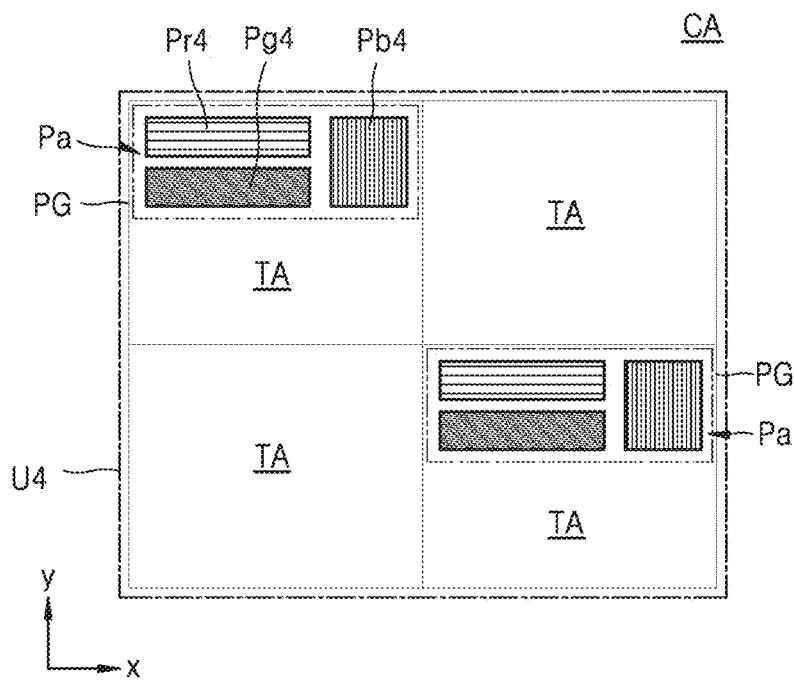

Referring to FIG. 13F, a component basic unit U4 arranged in the component area CA may include two pixel groups PG based on an S-stripe structure. The two pixel groups PG may be arranged apart from each other with a transmission area TA therebetween.

In the illustrated embodiment, an area of the component basic unit U4 occupied by the pixel groups PG may be about ¼ of the component basic unit U4. In other words, the area of the auxiliary subpixels Pa of FIG. 13F may be smaller than that of the auxiliary subpixels Pa of FIG. 13E.

Figure 13G:
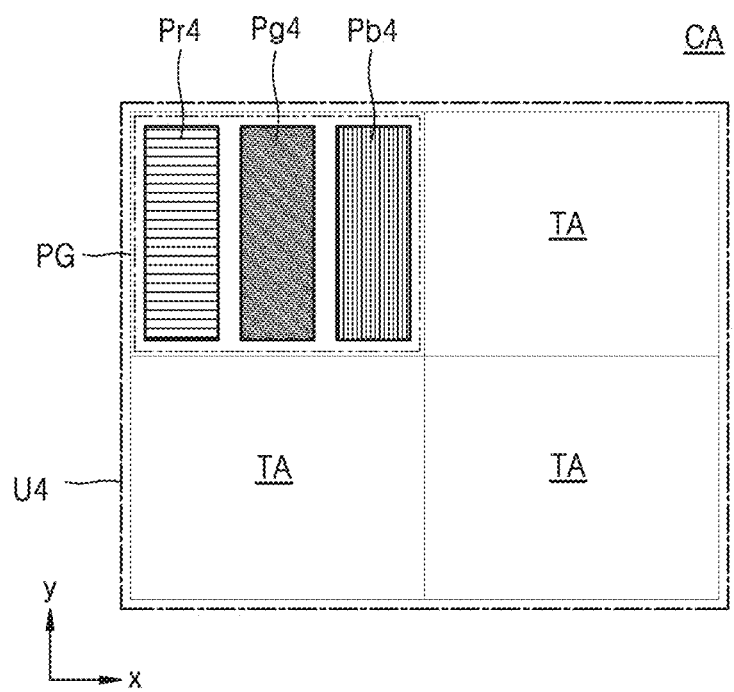

Referring to FIG. 13G, the pixel arrangement structure of the component area CA may be a stripe structure. In other words, a fourth red subpixel Pr4, a fourth green subpixel Pg4, and a fourth blue subpixel Pb4 may be juxtaposed in the x direction. In this case, each of the fourth red subpixel Pr4, the fourth green subpixel Pg4, and the fourth blue subpixel Pb4 may have a longer side in the y direction.

In an alternative embodiment, a fourth red subpixel Pr4, a fourth green subpixel Pg4, and a fourth blue subpixel Pb4 may be juxtaposed in the y direction. In this case, each of the fourth red subpixel Pr4, the fourth green subpixel Pg4, and the fourth blue subpixel Pb4 may have a longer side in the x direction.

Display panels and display devices in embodiments of the invention may smoothly display an image through a round portion.

Display panels and display devices in embodiments of the invention may realize various shapes of display areas.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display panel comprising:
    a substrate including:
        a main display area;
        a round display area disposed at a corner portion of the main display area and at least partially curved; and
        a middle display area arranged between the main display area and the round display area;
    a plurality of round display element areas arranged in the round display area and each including a plurality of round display elements each including a pixel electrode; and
    a plurality of round pixel circuit areas arranged in the middle display area and each including a plurality of round pixel circuits connected to the plurality of round display elements which are arranged in the round display area and emit light of a same color,
    wherein the plurality of round pixel circuits simultaneously drives the plurality of round display elements,
    the plurality of round display element areas is arranged in different rows and the plurality of round pixel circuit areas is arranged in different rows, and
    one edge of a round pixel circuit area arranged in a first row from among the plurality of round pixel circuit areas arranged in a same direction is spaced apart from one edge of a round pixel circuit area arranged in a second row from among the plurality of round pixel circuit areas by a first distance.

2. The display panel of claim 1, wherein the first distance is a width of one edge of a main unit area in the main display area wherein a plurality of main display elements each including a pixel electrode is arranged in the main display area.

3. The display panel of claim 1, wherein the first distance is twice a width of one edge of a main unit area arranged in the main display area, wherein a plurality of main display elements each including a pixel electrode is arranged in the main display area.

4. The display panel of claim 1, wherein the first distance is ½ of a width of one edge of a main display area arranged in the main display area, wherein a plurality of main display elements each including a pixel electrode is arranged in the main display area.

5. The display panel of claim 1, wherein a width of one edge of one of the plurality of round display element areas is four times a width of one edge of a main unit area arranged in the main display area, wherein a plurality of main display elements each including a pixel electrode is arranged in the main unit area.

6. The display panel of claim 1, wherein a width of one edge of one of the plurality of round display element areas is twice a width of one edge of a main unit area arranged in the main display area, wherein a plurality of main display elements each including a pixel electrode is arranged in the main unit area.

7. The display panel of claim 1, wherein a planar area of one of the plurality of round display element areas is twice a planar area of one of the plurality of round pixel circuit areas.

8. The display panel of claim 1, wherein a planar area of one of the plurality of round display element areas is equal to a planar area of one of the plurality of round pixel circuit areas.

9. The display panel of claim 1, wherein the plurality of round display elements comprise:
    a plurality of first round display elements which emit light of a first color;
    a plurality of second round display elements which emit light of a second color; and
    a plurality of third round display elements which emit light of a third color.

10. The display panel of claim 9, wherein the plurality of round pixel circuits comprises:
    a first pixel circuit connected to the plurality of first round display elements;
    a second pixel circuit connected to the plurality of second round display elements; and
    a third pixel circuit connected to the plurality of third round display elements.

11. The display panel of claim 1, wherein the plurality of round display elements is included in the plurality of round pixel circuit areas.

12. The display panel of claim 11, wherein some of the plurality of middle display elements are connected to one another and emit light of a same color.

13. The display panel of claim 1, wherein a rim of at least one of the round display area and the middle display area is round.

14. The display panel of claim 1, wherein a plurality of main display elements is arranged in the main display area.

15. The display panel of claim 14, wherein the plurality of main display elements is arranged in a same manner as the plurality of round display elements.

16. A display panel comprising:
a substrate including:
a main display area;
a round display area including a round boundary adjacent to a round portion of the substrate and a plurality of round display element areas in which a plurality of round display elements which emit light of a same color is arranged; and
a middle display area arranged between the round display area and the main display area and including:
a middle display element area, in which a plurality of middle display elements which emit light of a same color is arranged;
a round pixel circuit area, in which a round pixel circuit connected to a round display element of plurality of round display elements is arranged; and
a plurality of middle pixel circuit areas, in which a middle pixel circuit connected to the middle display element is arranged,
wherein the plurality of round display element areas is arranged in different rows, and the plurality of middle pixel circuit areas is arranged in different rows, and
the plurality of middle pixel circuit areas in different rows is arranged in a stepwise manner.

17. The display panel of claim 16, wherein a main unit area in which a plurality of main display elements is arranged is arranged in the main display area, and
a distance by which respective one edges of the plurality of middle pixel circuit areas arranged in different rows are spaced apart from each other is equal to a width of the main unit area in one direction or is twice the width.

18. The display panel of claim 16, wherein a main unit area in which a plurality of main display elements is arranged is arranged in the main display area, and
a distance by which respective one edges of the plurality of middle pixel circuit areas arranged in different rows are spaced apart from each other is half of a width of the main unit area in one direction.

19. The display panel of claim 16, wherein the round display element areas of the plurality of round display element areas arranged in different rows in the round portion of the round display area are arranged in a stepwise manner.

20. A display device comprising:
a display panel including a substrate, the substrate including:
a main display area;
a round display area disposed at a corner portion of the main display area and at least partially curved; and
a middle display area arranged between the main display area and the round display area;
a plurality of round display element areas arranged in the round display area and each including a plurality of round display elements each including a pixel electrode;
a plurality of round pixel circuit areas arranged in the middle display area and each including:
a plurality of round pixel circuits connected to the plurality of round display elements which are arranged in the round display area and emit light of a same color; and
a window arranged on the display panel,
wherein the plurality of round pixel circuits simultaneously drives the plurality of round display elements,
the plurality of round display element areas is arranged in different rows and the plurality of round pixel circuit areas is arranged in different rows, and
one edge of a round pixel circuit area arranged in a first row from among the plurality of round pixel circuit areas arranged in a same direction is spaced apart from one edge of a round pixel circuit area arranged in a second row from among the plurality of round pixel circuit areas by a first distance.

* * * * *